(12) United States Patent
Lee et al.

(10) Patent No.: US 11,263,429 B2
(45) Date of Patent: Mar. 1, 2022

(54) FINGERPRINT SENSOR AND DISPLAY DEVICE INCLUDING THE SAME

(71) Applicant: Samsung Display Co., Ltd., Yongin-Si (KR)

(72) Inventors: Jong Hyun Lee, Yongin-si (KR); Il Nam Kim, Yongin-si (KR); Ji Hun Ryu, Yongin-si (KR); Eun Jin Sung, Yongin-si (KR); Seong Ryong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/884,110

(22) Filed: May 27, 2020

(65) Prior Publication Data

US 2020/0380239 A1 Dec. 3, 2020

(30) Foreign Application Priority Data

May 28, 2019 (KR) .......................... 10-2019-0062650

(51) Int. Cl.
*G06K 9/00* (2006.01)
*G06K 9/20* (2006.01)
*H01L 27/32* (2006.01)

(52) U.S. Cl.
CPC .......... *G06K 9/0004* (2013.01); *G06K 9/209* (2013.01); *G06K 9/2027* (2013.01); *H01L 27/3234* (2013.01); *H01L 27/3265* (2013.01); *H01L 27/3272* (2013.01); *H01L 27/3276* (2013.01)

(58) Field of Classification Search
CPC .............. G06K 9/0004; G06K 9/00013; H01L 27/3234; H01L 27/3227; G06F 3/042; G06F 3/0421
See application file for complete search history.

(56) References Cited

U.S. PATENT DOCUMENTS

| 10,360,431 B2 | 7/2019 | Gozzini et al. | |
| 2011/0297944 A1* | 12/2011 | Choi | H01L 51/5215 257/59 |
| 2012/0007085 A1* | 1/2012 | Suzuki | H01L 27/124 257/59 |

(Continued)

FOREIGN PATENT DOCUMENTS

| CN | 108550610 A | * | 9/2018 | ............. G06F 21/32 |
| KR | 10-1948870 | | 2/2019 | |

*Primary Examiner* — Yuzhen Shen
(74) *Attorney, Agent, or Firm* — H.C. Park & Associates, PLC

(57) ABSTRACT

According to an aspect of the invention, a fingerprint sensor for a display device includes: a substrate having first and second surfaces; a light transmission layer including a first layer disposed on the first surface of the substrate and having first openings in at least one first conductive layer, and a second layer disposed on the first surface of the substrate and having second openings in at least one second conductive layer; a light emitting element layer disposed on the first layer and the second layer and having at least one light emitting element; and a sensor layer disposed on the second surface of the substrate and having light sensors, where at least a portion of the first openings and at least a portion of the second openings at least partially overlap and have different sizes.

14 Claims, 19 Drawing Sheets

(56) References Cited

U.S. PATENT DOCUMENTS

| | | | |
|---|---|---|---|
| 2014/0191210 A1* | 7/2014 | Sung | H01L 51/5209 |
| | | | 257/40 |
| 2017/0351898 A1 | 12/2017 | Zhang | |
| 2018/0012069 A1* | 1/2018 | Chung | G06K 9/2036 |
| 2019/0354740 A1* | 11/2019 | Li | H01L 51/5237 |
| 2020/0327296 A1* | 10/2020 | Wu | H01L 27/14678 |
| 2021/0091345 A1* | 3/2021 | Kishimoto | H01L 51/56 |

* cited by examiner

FINGERPRINT SENSOR AND DISPLAY DEVICE INCLUDING THE SAME

CROSS REFERENCE TO RELATED APPLICATION

This application claims priority from and the benefit of Korean Patent Application No. 10-2019-0062650, filed on May 28, 2019, which is hereby incorporated by reference for all purposes as if fully set forth herein.

BACKGROUND

Field

The invention relates generally to electronic devices and, more particularly, to a fingerprint sensor and a display device including the fingerprint sensor.

Discussion of the Background

In recent years, as a display device such as a smartphone or a tablet PC has been widely used, a biometric information authentication method using a fingerprint of a user has also been widely used. In order to provide a fingerprint sensing function, a fingerprint sensor may be provided in a form embedded or attached to a display device.

For example, the fingerprint sensor may form the sensor of a light sense method. The fingerprint sensor may include a light source, a lens, and a light sensor array. Reflected light within the display device can act as noise interfering with the light sensor array. When such a fingerprint sensor is attached to a display panel along with remediation measures for reducing light noise, the thickness of the display device and the manufacturing cost may increase.

The above information disclosed in this Background section is only for understanding of the background of the inventive concepts, and, therefore, it may contain information that does not constitute prior art.

SUMMARY

Fingerprint sensors and display devices including the same constructed according to the principles and exemplary embodiments of the invention use a light sensing method capable of reducing the thickness of a module and improving reliability. For example, the module thickness of the display device may be reduced by integrally forming a light transmission area with the circuit element layer in the fingerprint sensor.

Additionally, fingerprint sensors and display devices including the same constructed according to the principles and exemplary embodiments of the invention may prevent or reduce moiré effect that may be generated in the fingerprint sensor by adjusting a resolution between the opening portions of the light shielding layer and the light sensors provided in the sensor layer.

Additional features of the inventive concepts will be set forth in the description which follows, and in part will be apparent from the description, or may be learned by practice of the inventive concepts.

According to an aspect of the invention, a fingerprint sensor for a display device includes: a substrate having first and second surfaces; a light transmission layer including a first layer disposed on the first surface of the substrate and having first openings in at least one first conductive layer, and a second layer disposed on the first surface of the substrate and having second openings in at least one second conductive layer; a light emitting element layer disposed on the first layer and the second layer and having at least one light emitting element; and a sensor layer disposed on the second surface of the substrate and having light sensors, where at least a portion of the first openings and at least a portion of the second openings at least partially overlap and have different sizes.

The first openings and the second openings may have widths or diameters between about 5 μm and about 20 μm.

The first openings and the second openings can have a generally quadrangle shape in which a width in a first direction and a width in a second direction perpendicular to the first direction are the same or different.

Widths of the first openings may be greater than widths of the second openings.

The first layer may have a first light shielding layer to block some of ambient incident light and to transmit the remaining ambient incident light through the first openings, and the second layer may have a second light shielding layer to limit a field of view of the light.

The second layer can include circuit elements to control light emission of the at least one light emitting element.

The second layer may have a semiconductor layer including an active pattern of the circuit elements; a first gate layer including a gate electrode overlapping the active pattern; and a source-drain layer including a source electrode and a drain electrode connected to the active pattern.

The second layer may further include a second gate layer disposed between the first gate layer and the source-drain layer and including at least one capacitor electrode.

The second openings may have multilayer opening portions that overlap each other between the circuit elements disposed in the semiconductor layer, the first gate layer, the second gate layer, and the source-drain layer.

A distance between the semiconductor layer and the source-drain layer may be about 300 μm or less.

The first gate layer can include a light emitting control line to supply a light emitting control signal to the circuit elements, the second gate layer can include an initialization power line to supply initialization power to the circuit elements, and the source-drain layer can include a power line to apply power to the circuit elements.

The second openings may include multilayer openings adjacent to and overlapping the active pattern, the light emitting control line, the initialization power line, and the power line.

The fingerprint sensor may further include: a protective layer disposed between the first substrate and the sensor layer; and an adhesive layer disposed between the first substrate and the protective layer.

According to another aspect of the invention, a display device includes: a substrate having first and second surfaces; a light transmission layer disposed on the first surface of the substrate and including first openings having a first size; a circuit element layer disposed on the first surface of the substrate and including a plurality of conductive layers and second openings in the plurality of conductive layers, the second openings having at least a portion overlapping the first openings and having a second size different from the first size; a light emitting element layer disposed on the circuit element layer and including at least one light emitting element; and a sensor layer disposed on the second surface of the substrate and including light sensors.

The first openings and the second openings can have widths or diameters between about 5 μm and about 20 μm.

The first size may have a first width and the second size may have a second width, the first width being greater than the second width.

The light transmission layer may have a light shielding layer to block some of ambient incident light and to transmit the remaining ambient incident light through the first openings, and the circuit element layer to limit a field of view of the light.

The circuit element layer may include circuit elements to control light emission of the at least one light emitting element.

The circuit element layer may have: a semiconductor layer including an active pattern of the circuit elements; a first gate layer including a gate electrode overlapping the active pattern; a second gate layer disposed on the first gate layer and including at least one capacitor electrode; and a source-drain layer disposed on the second gate layer and including a source electrode and a drain electrode connected to the active pattern.

A distance between the semiconductor layer and the source-drain layer may be about 300 μm or less.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
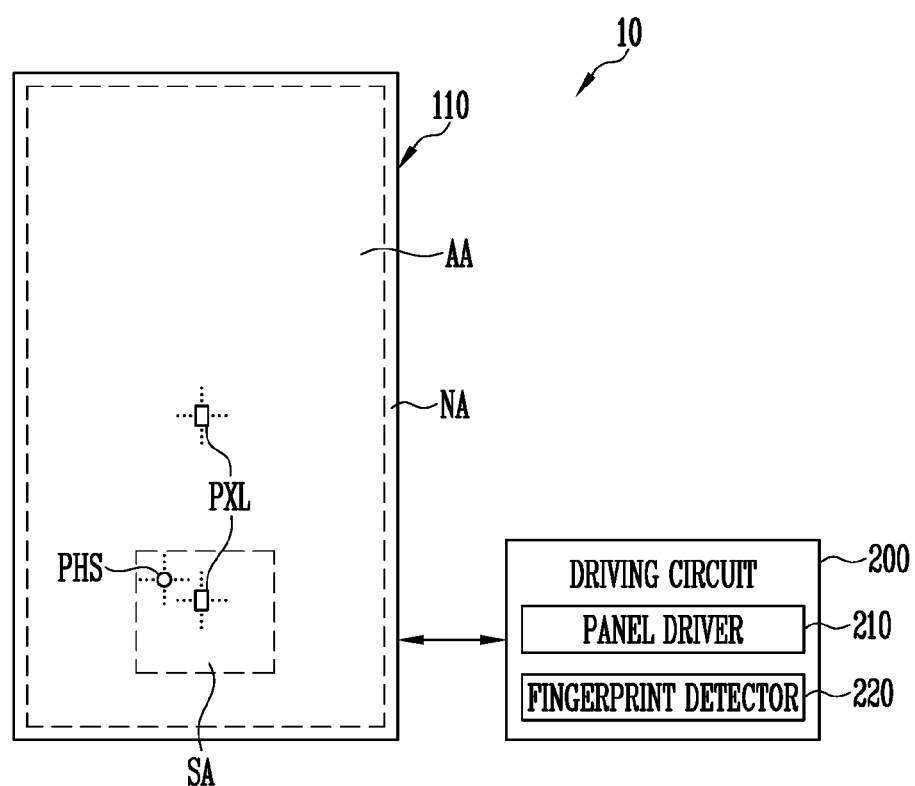
FIGS. 1 and 2 are block diagrams illustrating exemplary embodiments of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "disposed on," "connected to," or "coupled to" another element or layer, it may be directly on, connected to, or coupled to the other element or layer or intervening elements or layers may be present. When, however, an element or layer is referred to as being "directly on," "directly disposed on", "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, "light transmission layer" can be abbreviated "LTL" and means a layer including one or more light transmission hole array layers (LTHL) and/or one or more light shielding layers (PHL) as described herein. Exemplary embodiments of light transmission layers may include a single layer, such as a light transmission hole array layer (LTL) or a circuit element layer (BPL), or a plurality of layers, such as a BPL, a first substrate (SUB1), and PHL.

As used herein, the terms "width" and "diameter" may be used interchangeably when used in reference to a generally circular opening, for example, a pinhole (PIH), a first light transmission hole (LTH1), a second light transmission hole (LTH2), and multilayer opening portions (MLO).

Hereinafter, exemplary embodiments of the invention will be described in more detail with reference to the accompanying drawings. The same or similar reference numerals are used for the same components in the drawings.

Figure 2:
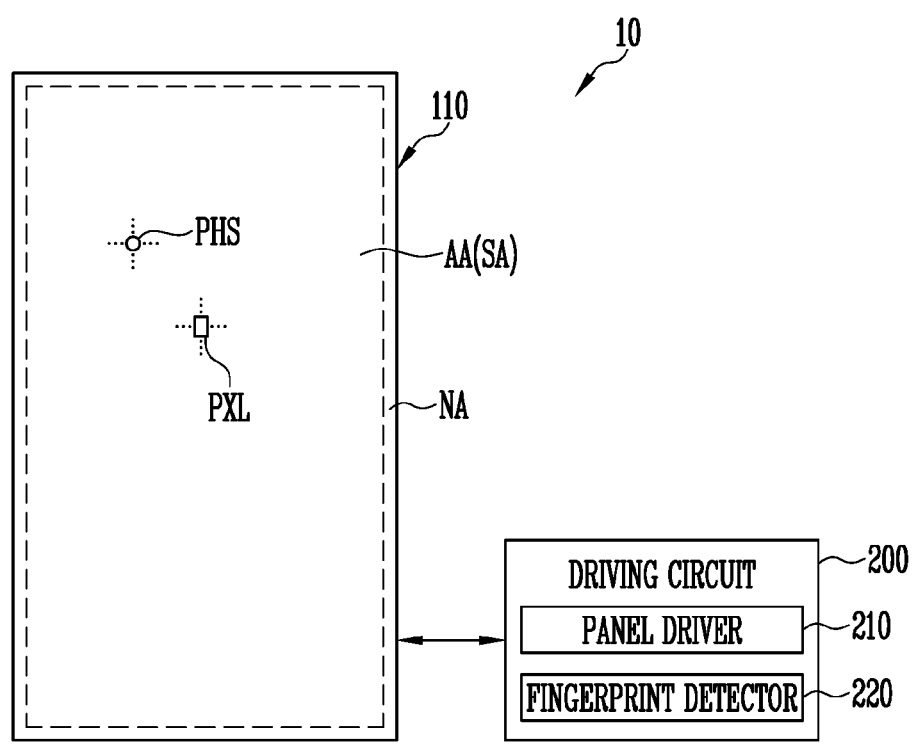

FIGS. 1 and 2 are block diagrams illustrating exemplary embodiments of a display device constructed according to principles of the invention. More specifically, FIGS. 1 and 2 are diagrams schematically illustrating a display panel included in a display device according to an embodiment and a driving circuit for driving the display panel. For convenience, in FIGS. 1 and 2, the display panel and the driving circuit are separate from each other, but the exemplary embodiments of the invention are not limited thereto. More specifically, all or a part of the driving circuit may be integrally implemented on the display panel.

Referring to FIGS. 1 and 2, a display device 10 includes a display panel 110 and a driving circuit 200 for driving the display panel 110.

The display panel 110 includes a display area AA and a non-display area NA. The display area AA is an area where a plurality of pixels PXL (which may be referred to as sub pixels) are provided, and may be referred to as an active area. In various embodiments, each of the pixels PXL may include at least one light emitting element. The display device 10 displays an image on the display area AA by driving the pixels PXL corresponding to externally input image data.

In various exemplary embodiments of the invention, the display area AA may include a sensing area SA. The sensing area SA may include at least some of the pixels PXL of the pixels PXL provided in the display area AA.

In an embodiment, at least a portion of the display area AA may be set as the sensing area SA, as shown in FIG. 1. In another example, the entire display area AA may be set as the sensing area SA as shown in FIG. 2.

Although FIG. 1 shows an example in which only one sensing area SA is formed on the display area AA, the exemplary embodiments of the invention are not limited thereto. That is, in various embodiments, a plurality of regularly or irregularly arranged sensing areas SA may be formed on the display area AA. In such an embodiment, the plurality of sensing areas SA may have the same or different areas and shapes.

In addition, although FIG. 1 shows an example in which the sensing area SA is formed in at least a portion of the display area AA, but the exemplary embodiments of the invention are not limited thereto. That is, in various embodiments, the display area AA and the sensing area SA may be provided so as to overlap only at least portions of the display area AA and the sensing area SA.

The non-display area NA is an area disposed around the display area AA and may be referred to as a non-active area. In various embodiments, the non-display area NA refers to an area other than the display area AA on the display panel 110. In an embodiment, the non-display area NA may include a wire area, a pad area, various dummy areas, and the like.

In various exemplary embodiments of the invention, the display device 10 may further include a plurality of light sensors PHS provided in the sensing area SA. In an embodiment, the light sensors PHSs may sense that light emitted from a light source is reflected by a user's finger and analyze the reflection light to sense the user's fingerprint. Hereinafter, exemplary embodiments of the invention will be described by using an example in which the light sensors PHS are used for a fingerprint sensing purpose, but in various embodiments, the light sensors PHS may be used for the purpose of performing various functions such as a touch sensor or a scanner.

In various exemplary embodiments of the invention, the light sensors PHS may be disposed on the sensing area SA. The light sensors PHS may overlap at least a part or all of the pixels PXL provided on the sensing area SA, or may be disposed around the pixels PXL. For example, at least some or all of the light sensors PHS may be provided between the pixels PXL. Various embodiments of the positional relationship between the light sensor PHS and the pixel PXL will be described in more detail with reference to FIGS. 3A to 3E.

In an embodiment in which the light sensors PHS are provided adjacent to the pixels PXL, the light sensors PHS may use the light emitting element provided in at least one pixel PXL disposed at or around the sensing area SA as the light source. In such an embodiment, the light sensors PHS together with the pixels PXL of the sensing area SA, particularly the light emitting elements provided in the pixels PXL, may form a fingerprint sensor used in a light sensing method. As described above, when the fingerprint sensor of a built-in type display device uses the pixels PXL as the light source without a separate external light source, the module thickness of the fingerprint sensor and the display device including the fingerprint sensor may be reduced, and the manufacturing costs may be reduced.

In various embodiments, the light sensors PHS may be disposed on a rear surface (for example, a back surface) of two surfaces of the display panel 110, which is opposite to a surface (for example, a front surface) where the image is displayed. However, the exemplary embodiments of the invention are not limited thereto.

The driving circuit 200 may drive the display panel 110. For example, the driving circuit 200 may output a data signal corresponding to the image data to the display panel 110, or may output a driving signal for the light sensor PHS and receive a sensing signal received from the light sensor PHS. The driving circuit 200 receiving the sensing signal may detect a fingerprint form of the user using the sensing signal.

In various exemplary embodiments of the invention, the driving circuit 200 may include a panel driver 210 and a fingerprint detector 220. For convenience, in FIGS. 1 and 2, the panel driver 210 and the fingerprint detector 220 are separate from each other, but the exemplary embodiments of the invention are not limited thereto. For example, at least a part of the fingerprint detector 220 may be integrated with the panel driver 210 or may operate in conjunction with the panel driver 210.

The panel driver 210 may sequentially supply the data signals corresponding to the image data to the pixels PXL while sequentially scanning the pixels PXL of the display area AA. Then, the display panel 110 may display an image corresponding to the image data.

In an embodiment, the panel driver 210 may supply a driving signal for fingerprint sensing to the pixels PXL. The driving signal may be provided so that the pixels PXL emit light and operate as the light source for the light sensor PHS. In such an embodiment, the driving signal for the fingerprint sensing may be provided to the pixels PXL provided in a specific area within the display panel 110, for example, the pixels PXL provided in the sensing area SA. In various embodiments, the driving signal for the fingerprint sensing may be provided by the fingerprint detector 220.

The fingerprint detector 220 may transfer the driving signal for driving the light sensors PHS to the light sensors PHS and may detect the user fingerprint based on the sensing signal received from the light sensors PHS.

FIGS. 3A, 3B, 3C, 3D, and 3E are plan views of exemplary embodiments of the pixels and the light sensors constructed according to principles of the invention illustrating the relative disposition of the pixels and light sensors. FIGS. 3A to 3E show different embodiments related to a relative size, a resolution, and positional relationship between at least one pixel PXL and light sensor PHS provided in the sensing area SA.

Figure 3A:
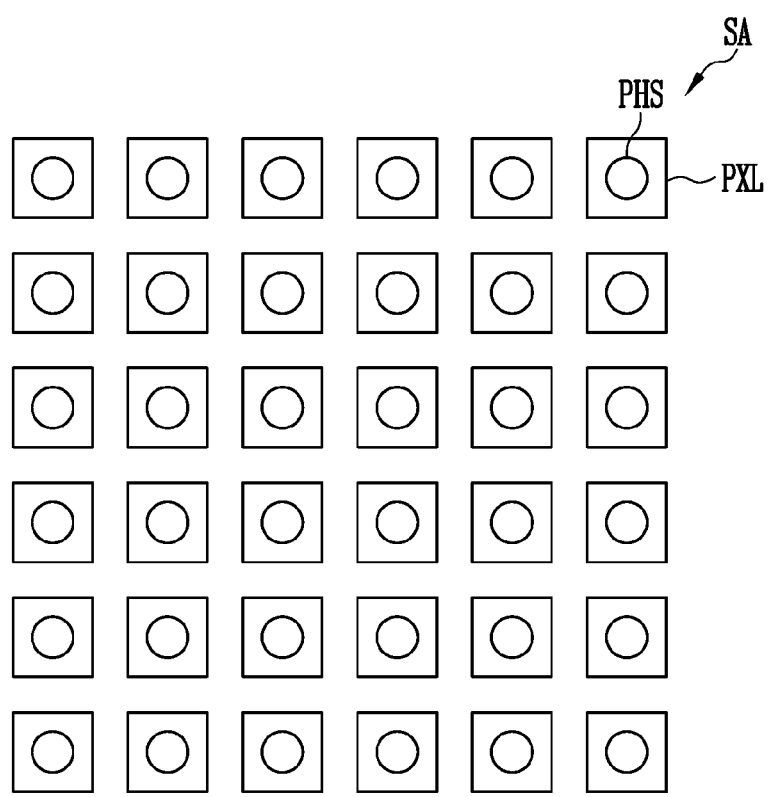
FIGS. 3A, 3B, 3C, 3D, and 3E are plan views of exemplary embodiments of pixels and light sensors constructed according to principles of the invention illustrating the relative disposition of the pixels and light sensors.

Referring to FIG. 3A, in the sensing area SA, the light sensors PHS may be disposed at the same resolution (density) as the pixels PXL. In other words, the same number of light sensors PHS as the pixels PXL may be disposed in the sensing area SA. In such an embodiment, the pixels PXL and the light sensors PHS may be disposed to form a 1:1 pair. In the embodiment of FIG. 3A, the pixels PXL and the light sensors PHS are disposed to overlap with each other, but in other embodiments, the pixels PXL and the light sensors PHS may be disposed so as not to overlap with each other or only portions of the pixels PXL and the light sensors PHS overlap with each other.

In the embodiment of FIG. 3A, the light sensors PHS has a size smaller than that of the pixels PXL, but the exemplary embodiments of the invention are not limited thereto. That is, in other embodiments, the light sensors PHS may have the same size as the pixels PXL or may have a size larger than that of the pixels PXL. Such an embodiment is shown in FIG. 3C.

Referring to FIGS. 3B to 3E, the light sensors PHS may be disposed at a resolution lower than that of the pixels PXL in the sensing area SA. In other words, the number of light sensors PHS is smaller than that of the pixels PXL may be disposed in the sensing area SA. In FIGS. 3B to 3E, an example in which one light sensor PHS is disposed per four pixels PXL is shown, but the exemplary embodiments of the invention are not limited thereto.

Figure 3B:
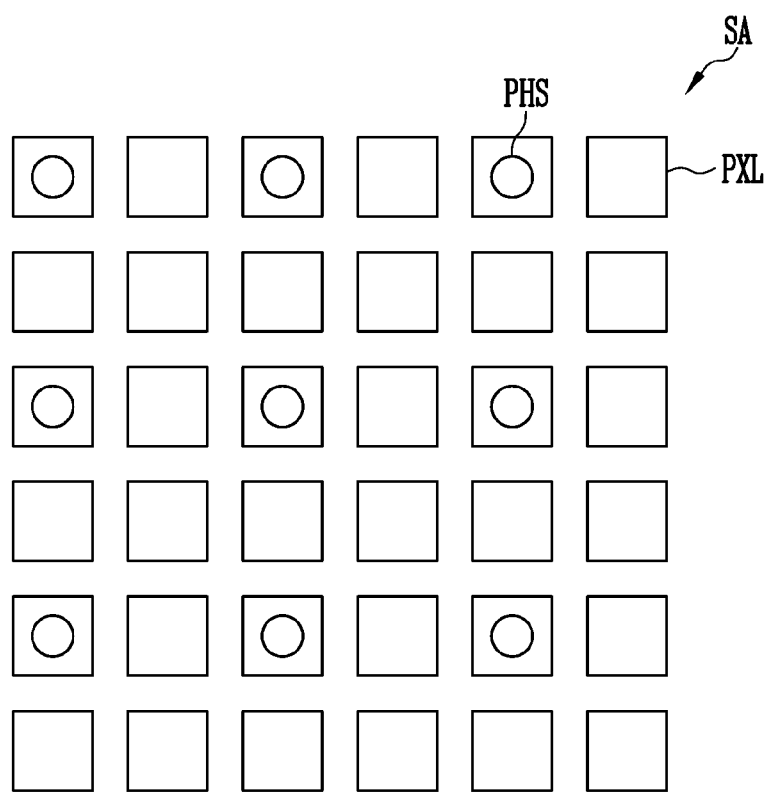
Figure 3C:
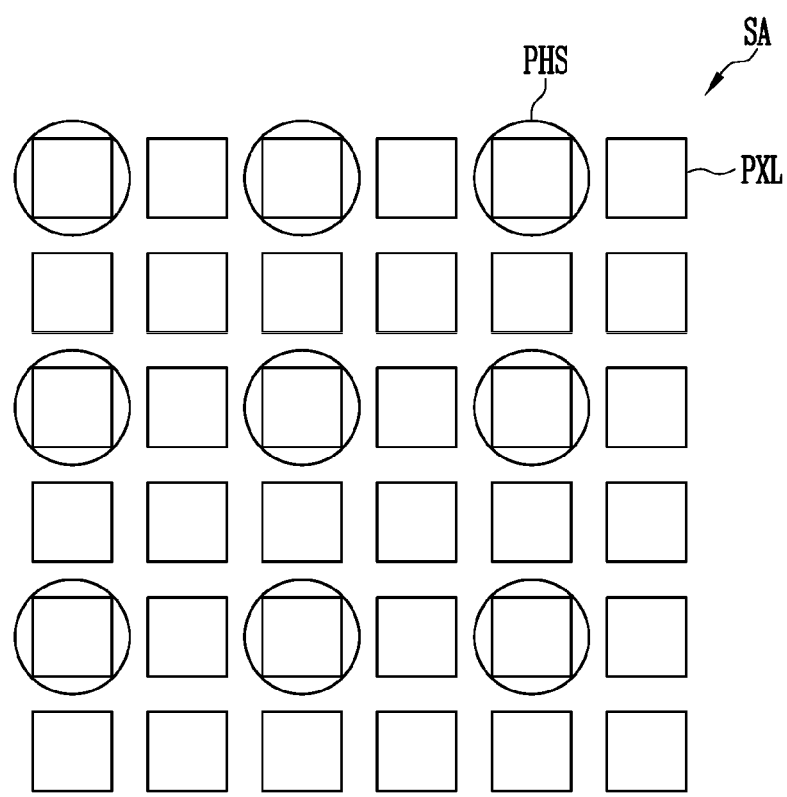
Figure 3D:
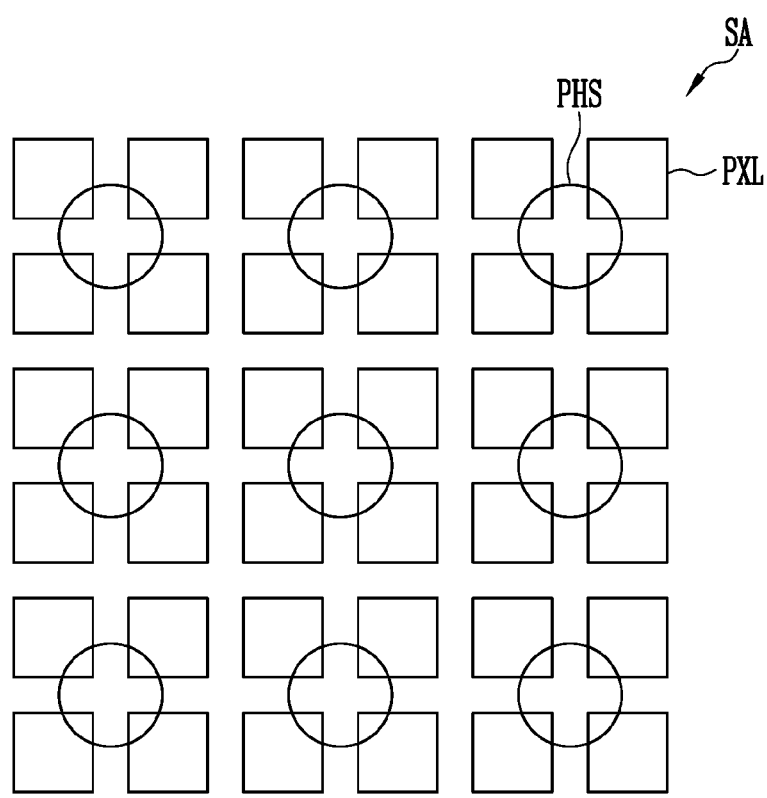
Figure 3E:
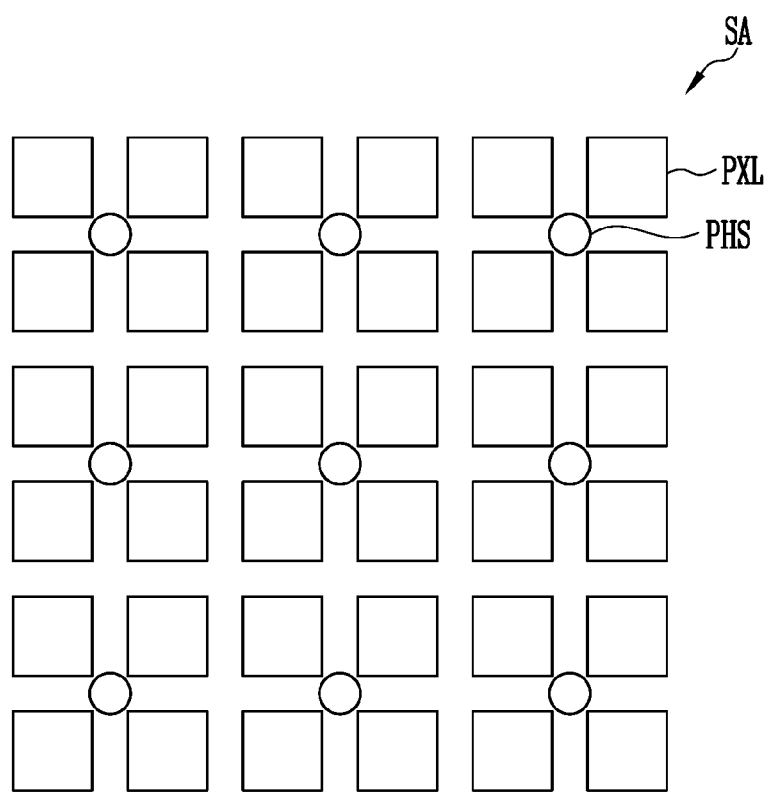

In such an embodiment, the light sensors PHS may have a size smaller than that of the pixels PXL as shown in FIGS. 3B and 3E, or may have a size larger than that of the pixels PXL as shown in FIGS. 3C and 3D.

When the light sensors PHS are disposed at the resolution lower than that of the pixels PXL, a part or all of the light sensors PHS may be disposed to overlap the pixels PXL. That is, the light sensors PHS may partially overlap with part of the pixels PXL as shown in FIGS. 3B and 3C.

Alternatively, the light sensors PHS may be disposed between the pixels PXL and partially overlap the pixels PXL as shown in FIG. 3D. In such an embodiment, the light sensors PHS may have the size larger than that of the pixels PXL as shown in FIG. 3D. For example, the light sensors PHS may have a size large enough to cover at least one pixel PXL.

Alternatively, the light sensors PHS may not overlap the pixels PXL as shown in FIG. 3E.

In various exemplary embodiments of the invention, the relative position between the pixels PXL and the light sensors PHS is not limited to the structures described above. That is, a shape, an arrangement, a relative size, the number, a resolution, and the like of the pixels PXL and the light sensors PHS in the sensing area SA may be variously modified. In addition, in various embodiments, the pixels PXL and the light sensors PHS may be disposed in a form in which one or more of the embodiments of FIGS. 3A to 3E are combined.

In addition, FIGS. 3A to 3E illustrate an example in which the light sensors PHS are regularly arranged in the sensing area SA, but the exemplary embodiments of the invention are not limited thereto, and in other embodiments, the light sensors PHS may be irregularly disposed in the sensing area SA.

Figure 4A:
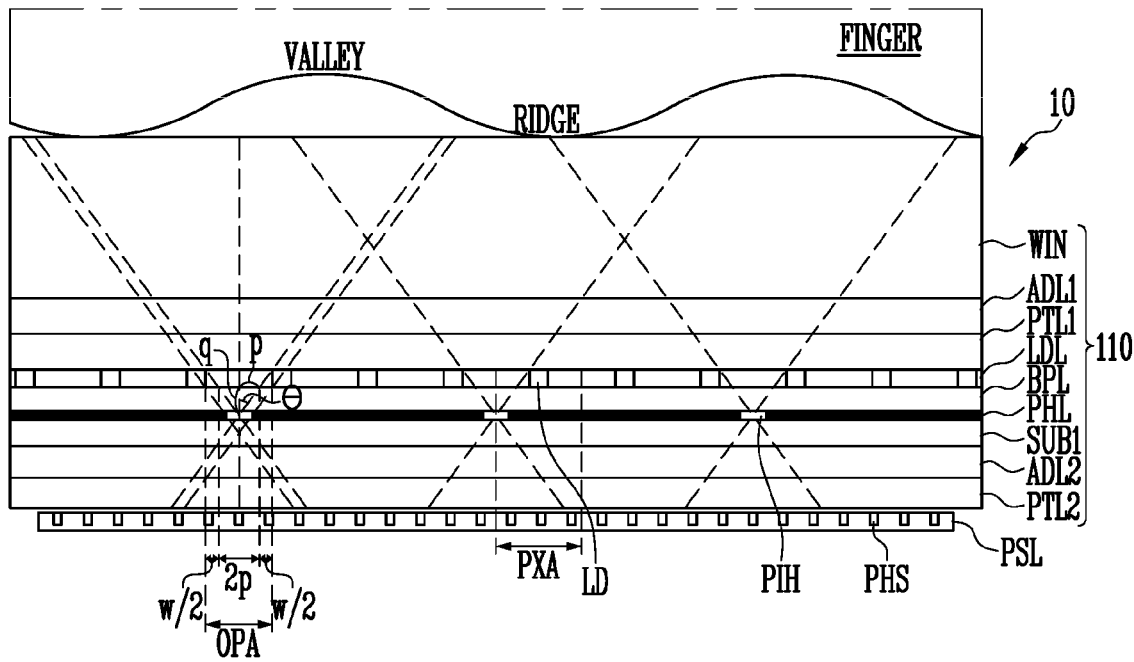
FIG. 4A is a cross-sectional view of an exemplary embodiment of a display device constructed according to principles of the invention.

FIG. 4A is a cross-sectional view of an exemplary embodiment of a display device according to an embodiment.

Referring to FIG. 4A, a display device 10 according to an exemplary embodiment of the invention may include a display panel 110 and a sensor layer PSL disposed on one surface of the display panel 110. In addition, the display device 10 may include a first substrate SUB1, and a circuit element layer BPL, a light emitting element layer LDL, a first protective layer PTL1, a first adhesive layer ADL1, and a window WIN, which are sequentially disposed on one surface (for example, an upper surface) of the first substrate SUB1. In addition, the display device 10 may also include a second adhesive layer ADL2 and a second protective layer PTL2 which are sequentially disposed on another surface (for example, a lower surface) of the first substrate SUB1.

The first substrate SUB1 may used as a base substrate of the display panel 110 and may be a substantially transparent transmissive substrate. The first substrate SUB1 may be a rigid substrate including glass or tempered glass, or a flexible substrate of a plastic material. However, the material of the first substrate SUB1 is not limited thereto, and the first substrate SUB1 may be made of various materials.

The first substrate SUB1 may include a display area AA and a non-display area NA as shown in FIGS. 1 and 2. In addition, the display area AA may include a plurality of pixel areas PXA in which each pixel PXL is disposed and/or formed.

The circuit element layer BPL may be disposed on one surface of the first substrate SUB1 and include at least one conductive layer. For example, the circuit element layer BPL may include a plurality of circuit elements forming pixel circuits of the pixels PXL, and wires for supplying various power and signals for driving the pixels PXL. In this case, the circuit element layer BPL may include various circuit elements such as at least one transistor and a capacitor, and a plurality of conductive layers for configuring wires connected thereto. In addition, the circuit element layer BPL may include at least one insulating layer provided between the plurality of conductive layers. In addition, the circuit element layer BPL may include a wire portion disposed in the non-display area NA of the first substrate SUB1 and supplies the power and signals corresponding to the wires connected to the pixels PXL.

The light emitting element layer LDL may be disposed on one surface of the circuit element layer BPL. The light emitting element layer LDL may include a plurality of light emitting elements LD connected to the circuit elements and/or the wires of the circuit element layer BPL through a contact hole or the like. In an embodiment, at least one of the plurality of light emitting elements LD may be disposed in each pixel area PXA.

Each of the pixels PXL may include the circuit elements disposed in the circuit is element layer BPL and at least one light emitting element LD disposed in the light emitting element layer LDL above the circuit element layer BPL. A detailed description of a representative structure of the pixel PXL will be described below.

The first protective layer PTL1 may be disposed above the light emitting element layer LDL so as to cover the display area AA. The first protective layer PTL1 may include a sealing member such as a thin film encapsulation ("TFE") or a sealing substrate, and may further include a protective film or the like in addition to the sealing member.

The first adhesive layer ADL1 is disposed between the first protective layer PTL1 and the window WIN to couple the first protective layer PTL1 and the window WIN. The first adhesive layer ADL1 may include a transparent adhesive such as an optical clear adhesive ("OCA"), and may include various adhesive materials.

The window WIN is a protective member disposed at the uppermost end of a module of the display device 10 including the display panel 110, and may be a substantially transparent transmissive substrate. The window WIN may have a multilayer structure selected from a glass substrate, a plastic film, and a plastic substrate. The window WIN may include a rigid or flexible substrate, and a configuration material of the window WIN is not particularly limited.

In various exemplary embodiments of the invention, the display device 10 may further include a polarization plate, a touch sensor layer (touch electrode layer), and/or the like. For example, the display device 10 may further include a polarization plate and/or a touch sensor layer disposed between the first protective layer PTL1 and the window WIN.

The second protective layer PTL2 may be disposed on the other surface of the first substrate SUB1. The second protective layer PTL2 may be coupled to the first substrate SUB1 by the second adhesive layer ADL2.

The second adhesive layer ADL2 may firmly bond (or attach) the first substrate SUB1 and the second protective layer PTL2. The second adhesive layer ADL2 may include a transparent adhesive such as an OCA. The second adhesive layer ADL2 may include a pressure sensitive adhesive ("PSA") in which an adhesive material acts when a pressure for adhering to an adhesive surface is applied. When the second adhesive layer ADL2 includes a PSA, the second adhesive layer ADL2 may be adhered to the adhesive surface only by pressure without an additional heat process or UV process at room temperature.

In an embodiment, the second adhesive layer ADL2 may include a material that absorbs specific light or may include a material that blocks the specific light. For example, the second adhesive layer ADL2 may include an infrared light absorbing material that absorbs infrared light having a high energy density, or may include an infrared light blocking material that blocks the infrared light.

The infrared light absorbing material may include, for example, an inorganic based oxide including antimony-tin oxide ("ATO"), indium tin oxide ("ITO"), tungsten oxide, carbon black, and the like, and a metal such as silver (Ag). In a case of the inorganic based oxide, the infrared light absorbing material may selectively transmit light of a visible light region and absorb the infrared light. In addition, the infrared light absorbing material may include, for example, an organic based dye. The organic based dye may be, for example, a dye used in a color filter included in the display panel 110.

For example, the infrared light blocking material may be at least one selected from a borate mixture, a carbonate mixture, an alumina mixture, a nitrate mixture, a nitrite mixture, lithium borate and sodium borate, potassium borate, magnesium borate, calcium borate, strontium borate, barium borate, sodium borate, $Na_2B_4O_x$, colemanite, lithium carbonate, sodium carbonate, potassium carbonate, calcium carbonate, calcite, $CaCO_3$, dolomite, and magnesite. In addition, the infrared light blocking material may be at least one selected from one group selected from a nickel dithiol system, a dithiol based metal complex compound, a cyanine dye, a squalium dye, a croconium dye, a diimonium dye, an aminium dye, an ammonium dye, a phthalocyanine dye, a naphthalocyanine and an aminium dye, an anthraquinone dye, a naphthoquinone-based dye, a polymer condensation azo based pyrrole-based dye (pyrroles azo dyes), a polymethine dye, and a propylene-based dye.

When a hand of a user is placed (or positioned) on a display surface (for example, one surface on which an image is displayed) of the display device 10, the display device 10 may perform a function of sensing a fingerprint of a user through a light sensor PHS described below. When external light is input to the display device 10 while the fingerprint of the user is sensed, the visible light region of the external light is blocked by hand of the user, but the infrared light may be transmitted through the hand of the user and may be incident on the light sensors PHS. The infrared light incident on the light sensors PHS act as noise, thereby reducing recognition accuracy of light reflected by the hand of the user.

When the second adhesive layer ADL2 includes the infrared light absorbing material and/or the infrared light blocking material as in the above-described embodiment, even though the infrared light of external light transmit the hand of the user, the infrared light is absorbed and/or blocked by the second adhesive layer ADL2, and thus the infrared light is not incident on the light sensors PHS. Therefore, fingerprint recognition accuracy may be improved.

The second protective layer PTL2 may block inflow of oxygen and moisture from the outside and may be provided in a form of a single layer or a multilayer. The second protective layer PTL2 may be formed in a film to further secure flexibility of the display panel 110. The second protective layer PTL2 may be coupled to the sensor layer PSL through another adhesive layer including a transparent adhesive such as an OCA.

In various embodiments, a selective light blocking film may be further provided under the second protective layer PTL2. The selective light blocking film may prevent the light from entering into the light sensors PHS of the sensor layer PSL by blocking a specific frequency area, for example, infrared light, of the external light introduced into the display device 10. In the above description, the selective light blocking film is further provided under the second protective layer PTL2, but the exemplary embodiments of the invention are not limited thereto. That is, in another embodiment, the selective light blocking film may be provided to any layer of the display device 10 when the selective light blocking film is disposed above the sensor layer PSL. In addition, the selective light blocking film may be omitted when an infrared light blocking component is included in the display panel 110.

The light shielding layer PHL may be disposed between the light emitting element layer LDL and the sensor layer PSL described below. For example, the light shielding layer PHL may be disposed between the first substrate SUB1 and the circuit element layer BPL as shown in FIG. 4A. The light shielding layer PHL may include a plurality of pinholes PIH as described with reference to FIG. 2.

The display panel 110 may be formed to be transparent in an area where the pinhole PIH is disposed so that the reflection light reflected from the fingerprint area of the finger may transmit through the pinhole PIH. In addition, in order to reduce loss of the reflection light necessary for fingerprint sensing, the display panel 110 may be formed so that light satisfying a field of view ("FOV", or referred to as a "viewing angle") of a predetermined angle range is transmitted through each pinhole PIH.

For example, the display panel 110 may be formed to be transparent in an area having an area larger than that of the pinhole PIH and overlapping the pinhole PIH centered on an area where each pinhole PIH is disposed. Hereinafter, an area formed to be transparent so that the reflection light may transmit is referred to as an optical opening area OPA.

Based on a center of each pin hole PIH, when a field of view angle of an exemplary range is θ, the thickness of circuit element layer BPL is q, and a width of the OAP formed at a boundary surface of the circuit element layer BPL and the light emitting element layer LDL is 2p, "$2p=2\times(q\times\tan\theta)$" may be satisfied. In an embodiment, the field of view may be an angle of a range from about 30 degrees to about 60 degrees, for example, about 45 degrees, but is not limited thereto.

The pinholes PIH may have a width w in a range of a predetermined width w, for example, about 5 μm to about 20 μm, and a width of the optical opening area OPA considering this may be 2p+w. In this manner, the width of the optical opening area OPA to be secured in each layer of the display device 10 may be gradually increased as the distance from the light shielding layer PHL is increased (that is, as each of the distances from an upper portion and a lower portion of the light shielding layer PHL is increased).

The width w (or diameter) of the pinholes PIH may be set to about 10 times or more, for example, about 4 μm or about 5 μu m or more of a wavelength of the reflection light so as to prevent diffraction of light. In addition, the width w of the pinholes PIH may be set to a size enough to prevent image blur and to more clearly sense a shape of the fingerprint. For example, the width w of the pinholes PIH may be set to about 20 μm or less. However, the exemplary embodiments of the invention are not limited thereto, and the width w of the pinholes PIH may vary according to a wavelength band of the reflection light and/or thicknesses of each layer of the module.

A distance (or pitch) between adjacent pinholes PIH may be set in consideration of a distance between the light shielding layer PHL and the sensor layer PSL and a wavelength range of the reflection light. For example, when the field of view of the reflection light to be secured is about 45 degrees, the distance between the adjacent pinholes PIH may be set to twice or more the distance between the light shielding layer PHL and the sensor layer PSL, and may be set to a value equal to or greater than a value obtained by adding a predetermined error range to the distance. In this case, the images observed by the respective light sensors PHS may be prevented from overlapping with each other, thereby preventing image blur.

The sensor layer PSL is attached to a rear surface (for example, a back surface) of the display panel 110 so as to overlap at least one area of the display panel 110. The sensor layer PSL may be disposed so as to overlap the display panel 110 in at least the display area AA. The sensor layer PSL may include a plurality of light sensors PHS distributed at a predetermined resolution and/or distance. The distance between the light sensors PHS may be set tightly so that the reflection light reflected from an object to be observed (for example, a specific area of the finger such as a fingerprint area) may be incident on at least two adjacent light sensors PHS.

The light sensors PHS of the sensor layer PSL may output an electrical signal corresponding to the reflection light received through the pinholes PIH as a sensing signal. The reflection light received by each light sensor PHS may have different optical characteristics (for example, frequency, wavelength, size, and the like) according to whether the reflection light is due to a valley of the fingerprint formed on the finger of the user or due to a ridge. Therefore, each of the light sensors PHS may output a sensing signal having different electrical characteristics corresponding to the optical characteristics of the reflection light. The sensing signal output by the light sensors PHS may be converted into image data and used for fingerprint identification of the user.

As described above, the display device 10 includes the fingerprint sensor including the light emitting element layer LDL, the sensor layer PSL, and the light shielding layer PHL. The light emitting element layer LDL may include the light emitting elements LD that may also function as a light source of a light sense method sensor. The sensor layer PSL may include the light sensors PHS that receives light emitted from the light emitting element layer LDL and reflected from an object (for example, the fingerprint area of the finger) positioned above the display device 10. The light shielding layer PHL may include the pinholes PIH disposed between the light emitting element layer LDL and the sensor layer PSL to selectively transmit the reflection light.

According to an embodiment, the fingerprint sensor may further include the optical opening area OPA formed inside the display panel 110 or the like in order to reduce the loss of reflection light incident on each pinhole PIH within a predetermined field of view angle range. In addition, the fingerprint sensor may include a light control layer disposed inside the display panel 110 to control a light path so as to more easily control the field of view. Various embodiments of the light control layer will be described below with reference to FIGS. 9 to 12C.

On the other hand, the display device 10 also utilizes the light emitting elements LD of the pixels PXL as the light source of the fingerprint sensor, but the exemplary embodiments of the invention are not limited thereto. For example, the display device according to another embodiment may have a separate light source for the fingerprint sensing.

A fingerprint sensing method of the display device 10 according to the above-described embodiment will be briefly described as follows. During a fingerprint sensing period during which the light sensors PHS are activated, in a state in which the finger (for example, the fingerprint area) of the user is in contact or close to the display area AA, the pixels PXL (particularly, the light emitting elements LD included in the pixels PXL) of the display area AA may be emitted. For example, during the fingerprint sensing period, all of the pixels PXL of the display area AA may be simultaneously or sequentially emitted. Alternatively, only some pixels PXL may be emitted at predetermined intervals among the pixels PXL of the display area AA or only some pixels PXL that emit light of a specific color (for example, light having a short wavelength such as blue light) may be selectively emitted.

Some of light emitted from the pixels PXL may be reflected by the finger of the user, and pass through the optical opening area OPA and the pinholes PIH formed in the respective layers of the display device 10 to be incident on the light sensors PHS. At this time, a fingerprint shape (fingerprint pattern) of the user may be detected based on a light amount difference and/or a waveform of the reflection light reflected from ridges and valleys of each fingerprint.

Figure 4B:
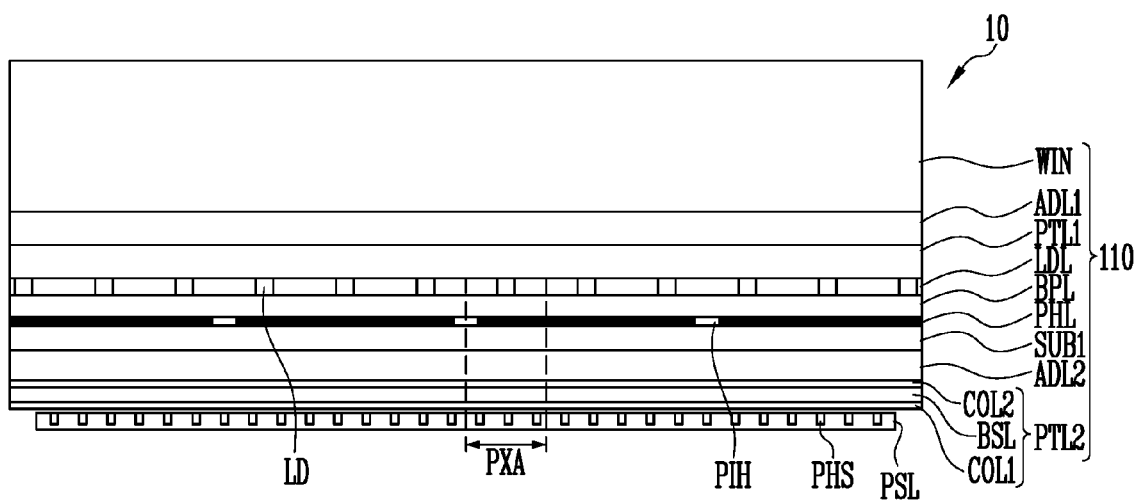
FIG. 4B is a cross-sectional view of another exemplary embodiment of a display device constructed according to principles of the invention.

FIG. 4B is a cross-sectional view of another exemplary embodiment of a display device constructed according to principles of the invention. In FIG. 4B, the detailed description of the same or similar configuration as in the embodiment of FIG. 4A described above will be omitted to prevent redundancy.

Referring to FIG. 4B, the display panel 110 includes a second protective layer PTL2. The second protective layer PTL2 may include a base layer BSL, and a first coating layer COL1 and a second coating layer COL2 formed on a lower surface and an upper surface of the base layer BSL, respectively.

The base layer BSL may be formed in a plastic film form including at least one organic film. For example, the plastic film may be manufactured by including at least one of thermoplastic polymer resin such as polycarbonate ("PC"), polyimide ("PI"), polyethersulfone ("PES"), polyarylate ("PAr"), polyethylene naphthalate ("PEN"), polyethylene terephthalate ("PET"), cycloolefin copolymer, epoxy, thermosetting polymer resin such as unsaturated polyester, phenol (PF), silicone, polyurethane, and the like.

In an embodiment, the material of the base layer BSL is not limited to those described above, and the material of the base layer BSL may be selected as a suitable material according to a design condition or the like of the display panel 110 among materials capable of protecting the layers disposed thereon. According to an embodiment, the base layer BSL may also include the same material as the infrared light absorbing material and/or the infrared light blocking material included in the second adhesive layer ADL2 of the display device 10.

Any one of the first and second coating layers COL1 and COL2 may be coated with an infrared light reflecting and blocking material and the other may be coated with an infrared light absorbing material. For example, the first coating layer COL1 may be a layer on which a mixture in which the infrared light absorbing material is mixed is applied (or coated), and the second coating layer COL2 may be a layer on which a mixture in which the infrared light reflecting and blocking material is mixed is applied (or coated). Examples of the infrared light reflecting and blocking material may include titanium oxide ($TiO_2$), magnesium fluoride ($MgF_2$), and the like, but the exemplary embodiments of the invention are not limited thereto.

As described above, when the second protective layer PTL2 includes the infrared light reflecting and/or blocking material and the infrared light absorbing material, even though the infrared light of the external light transmits through the hand of the user, the infrared light is not incident on the sensor layer PSL by the second protective layer PTL2 positioned above the sensor layer PSL. Therefore, the light sensors PHS may more accurately recognize the fingerprint of the user without interference of the external light.

According to an embodiment, the infrared light may be blocked by configuring some configurations of the display panel 110, for example, the second adhesive layer ADL2 and/or the second protective layer PTL2 to include the infrared light absorbing material and/or the infrared light blocking material, without addition of a separate component such as an infrared light blocking film. Therefore, the manufacturing costs of the display device 10 may be reduced and the thickness of the display device 10 may be further reduced.

Hereinafter, the light shielding layer PHL will be described in more detail.

Figure 5:
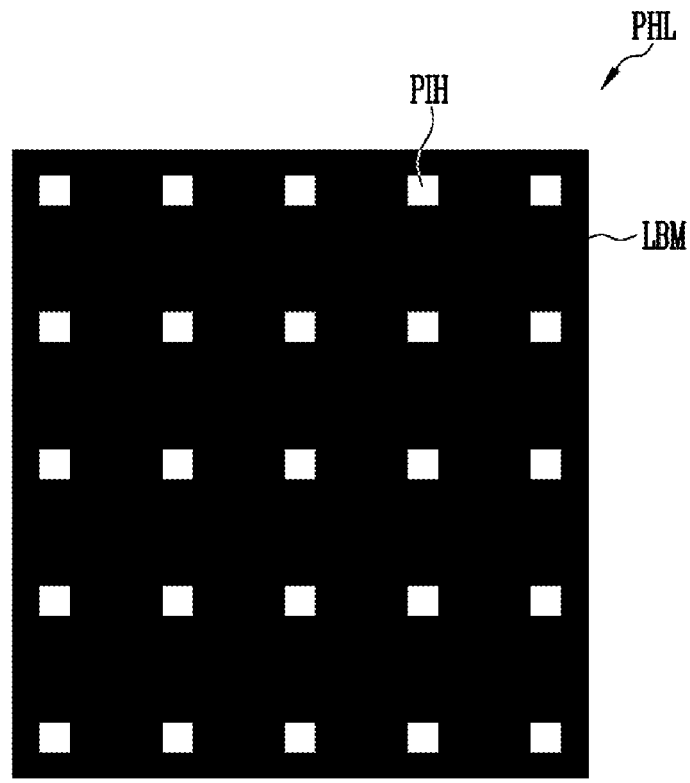
FIG. 5 is a plan view illustrating an exemplary embodiment of a light shielding layer constructed according to principles of the invention.

FIG. 5 is a plan view illustrating an exemplary embodiment of a light shielding layer constructed according to principles of the invention.

Referring to FIG. 5, the light shielding layer PHL may include a light shielding mask LBM and a plurality of pinholes PIH distributed in the light shielding mask LBM.

The light shielding mask LBM may be formed of a light blocking and/or a light absorbing material. For example, the light shielding mask LBM may be formed of an opaque metal layer (conductive layer) that is locally opened in an area where each pinhole PIH is disposed. However, the configuration material of the light shielding mask LBM is not limited to metal, and the light shielding mask LBM may be formed of various materials capable of blocking light transmission. For example, the light shielding mask LBM may be formed of the currently known black matrix material.

The pinholes PIH may be opening portions dispersed in the light shielding mask LBM. The pinholes PIH may be dispersed in the light shielding mask LBM in a regular or irregular pattern so as to have a certain size and distance.

In the embodiment of FIG. 5, the pinholes PIH are shown as generally rectangular shapes, but the exemplary embodiments of the invention are not limited thereto. That is, in various embodiments, the pinholes PIH may have various shapes such as generally rectangular, circle, ellipse, and polygon shapes, and the like. However, the exemplary embodiments of the invention are not limited thereto, and the size, shape, number, resolution, and/or arrangement structure of the pinholes PIH may be variously changed.

The light shielding layer PHL may be disposed between the light emitting element layer LDL in which the light emitting elements LD are disposed and the sensor layer PSL in which the light sensors PHS are disposed in the display device 10 in FIGS. 1 to 4B. The light shielding layer PHL may form an optical system for selectively transmitting only some of light and blocking the remaining light.

The light shielding layer PHL may form the fingerprint sensor together with the above-described light sensors PHS. In addition, the light shielding layer PHL may be made integrally with the circuit element layer of the display panel 110. In this case, the module thickness of the fingerprint sensor and the display device including the fingerprint sensor may be reduced or minimized.

FIGS. 6A, 6B, 6C, and 6D are plan views of exemplary embodiments of pixels, pinholes, and light sensors constructed according to principles of the invention illustrating the relative disposition of the pixels, pinholes, and light sensors. Specifically, FIGS. 6A to 6D illustrate different embodiments related to relative sizes, resolutions, and/or disposition relationships of the pixels PXL, pinholes PIH, and light sensors PHS disposed in the sensing area SA of FIGS. 1 to 4B.

Figure 6A:
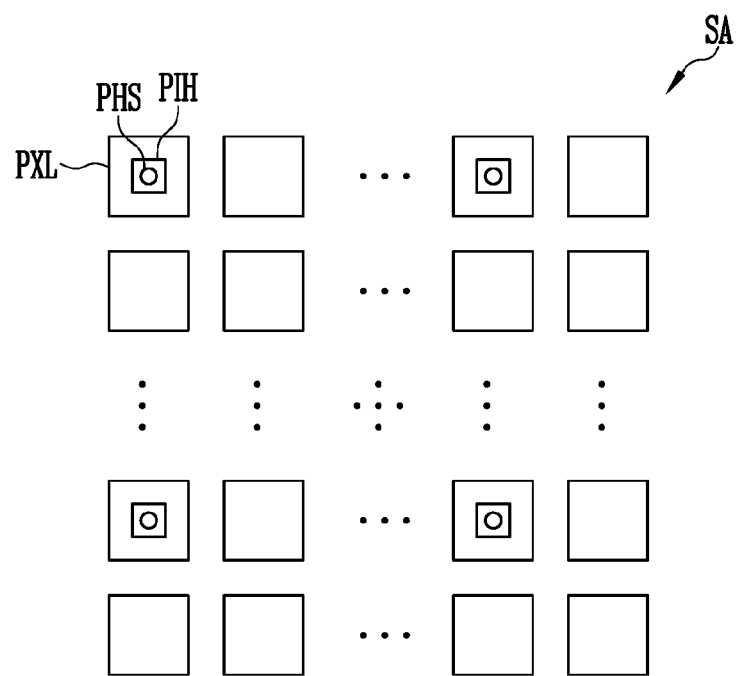
FIGS. 6A, 6B, 6C, and 6D are plan views of exemplary embodiments of pixels, pinholes, and light sensors constructed according to principles of the invention illustrating the relative disposition of the pixels, pinholes, and light sensors.

Referring to FIG. 6A, the sensing area SA may include a smaller number of pinholes PIH and light sensors PHS than that of the pixels PXL. In addition, the pinholes PIH and the light sensors PHS may have a size smaller than that of the pixels PXL and may be distributed in the sensing area SA with a resolution lower than the pixels PXL.

On the other hand, although FIG. 6A shows an embodiment in which the number of the pinholes PIH and the light sensors PHS are less than the number of the pixels PXL, the exemplary embodiments of the invention are not limited thereto. That is, in another embodiment, the pinholes PIH and the light sensors PHS may be distributed in the sensing area SA at substantially the same number and distance to correspond to a one to one basis. For example, the pinholes PIH and the light sensors PHS may be disposed so as to overlap with each other in pairs on a one to one basis. According to an embodiment, the pair of pinholes PIH and light sensor PHS may be disposed so as to overlap any one of the pixels PXL disposed in the sensing area SA, but the exemplary embodiments of the invention are not limited thereto. For example, the pinholes PIH and the light sensors PHS may be alternately disposed so as not to overlap with each other, or may be disposed so as not to overlap the pixels PXL.

The pinholes PIH and the light sensors PHS may have the same or different sizes. That is, the relative sizes and resolutions of the pinholes PIH and the light sensors PHS are not particularly limited.

Figure 6B:
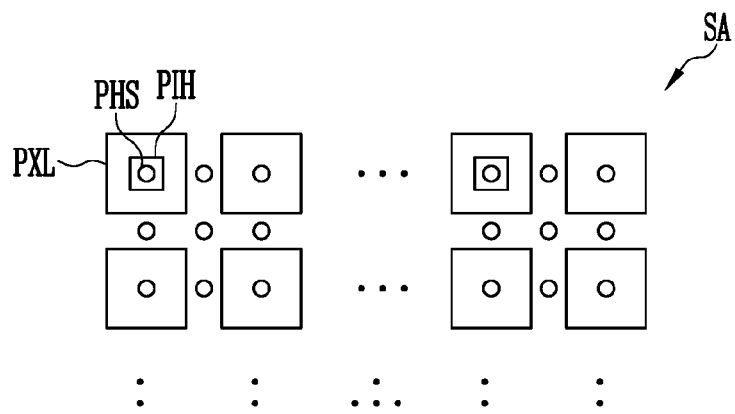

Referring to FIG. 6B, the sensing area SA may include a smaller number of pinholes PIH than that of the pixels PXL and a larger number of light sensors PHS than that of the pixels PXL. In addition, the pinholes PIH and the light sensors PHS may have a size smaller than that of the pixels PXL, the pinholes PIH may be distributed in the sensing area SA with a resolution lower than that of the pixels PXL, and the light sensors PHS may be densely distributed in the sensing area SA with a resolution higher than that of the pixels PXL.

At least a part of the light sensors PHS may overlap any one of the pinholes PIH and/or the pixels PXL, but the exemplary embodiments are not limited thereto. For example, a part of the light sensors PHS may be disposed so as to overlap with pinholes PIH and/or the pixels PXL, and others may be disposed in a gap between the pixels PXL.

Figure 6C:
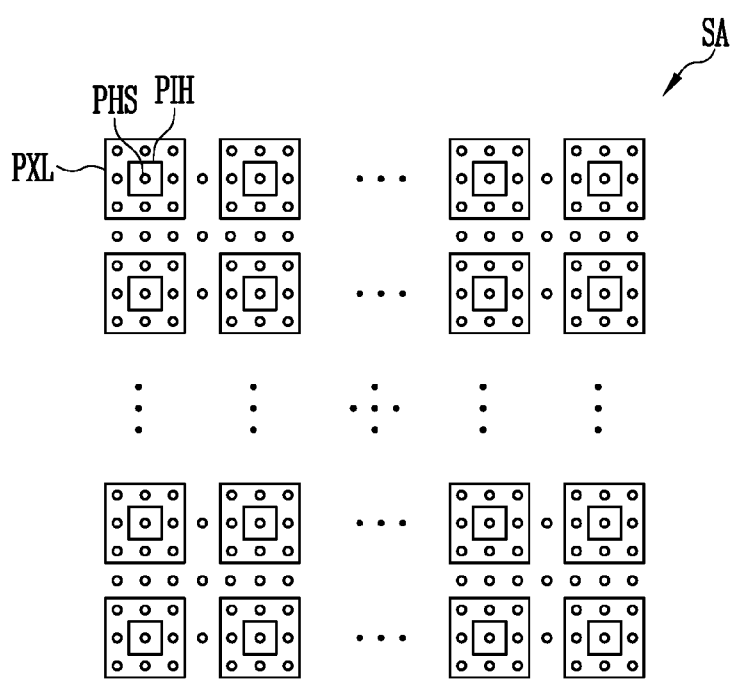
Figure 6D:
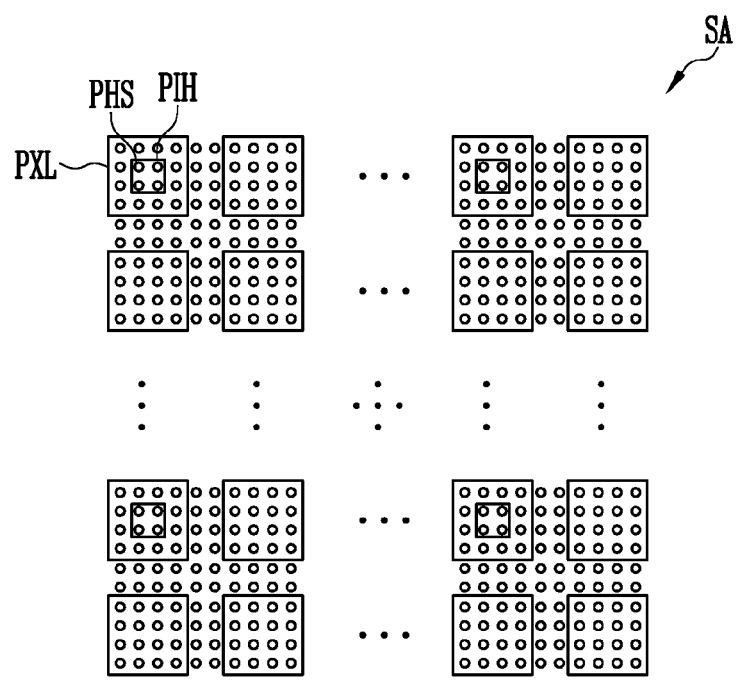

Referring to FIGS. 6C and 6D, the light sensors PHS may be distributed in the sensing area SA to have a smaller size and higher resolution than the embodiment shown in FIG. 6B. For example, a plurality of light sensors PHS may overlap each pinhole PIH and/or pixel PXL. On the other hand, the pinholes PIH may be distributed in the sensing area SA with the same or different resolution as the pixels PXL. For example, the pinholes PIH may be distributed in the sensing area SA with the same resolution as the pixels PXL as shown in FIG. 6C, or may be distributed in the sensing area SA with a resolution lower than that of the pixels PXL as shown in FIG. 6D.

FIGS. 6A to 6D show an embodiment in which the pinholes PIH and the light sensors PHS are arranged in a regular array form in the sensing area SA, but the exemplary embodiments of the invention are not limited thereto. That is, the pinholes PIH and/or the light sensors PHS may be irregularly scattered in the sensing area SA, or may be distributed in different densities or arrangement structures according to each area or section of the sensing area SA.

The positional relationship of the pixels PXL, pinholes PIH, and light sensors PHS is not limited to the embodiments shown in FIGS. 6A to 6D. For example, the shape, arrangement type, relative size, number, resolution, and/or mutual disposition relationship of the pixels PXL, pinholes PIH and/or light sensors PHS may be variously changed.

FIGS. 7, 8, 9, 10, 11, 12A, 12B, and 12C are cross-sectional views of other exemplary embodiments of display devices constructed according to principles of the invention. In FIGS. 7 to 12C, a detailed description of the same or similar configuration as at least one embodiment described above in the description with reference to FIGS. 7 to 12C will be omitted to prevent redundancy.

Figure 7:
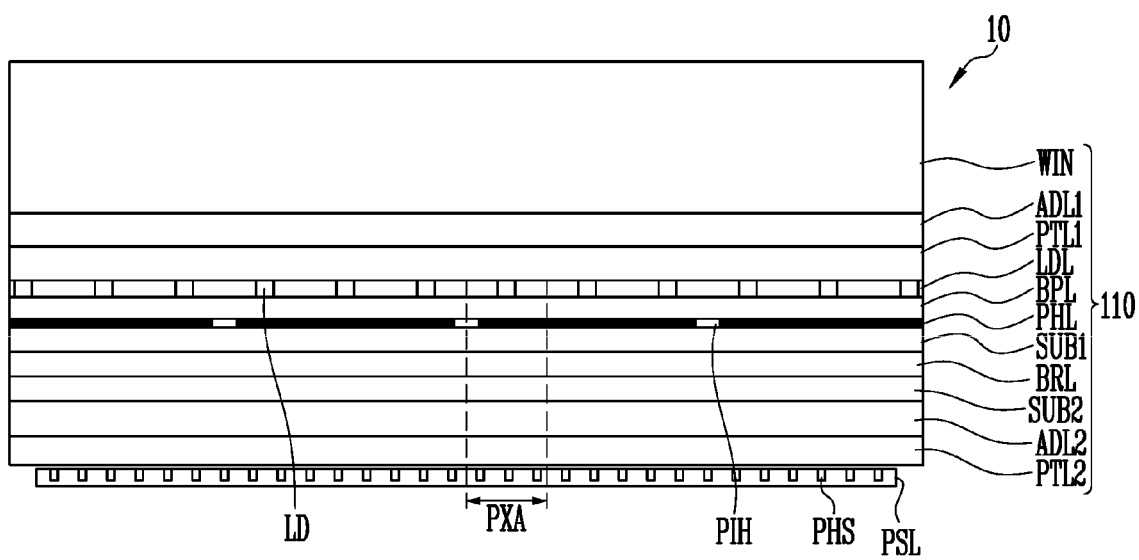
FIGS. 7, 8, 9, 10, 11, 12A, 12B, and 12C are cross-sectional views of other exemplary embodiments of display devices constructed according to principles of the invention.

Referring to FIG. 7, the display panel 110 may further include a second substrate SUB2 disposed on one surface (for example, a lower surface) of the first substrate SUB1. The second substrate SUB2 may be disposed between the first substrate SUB1 and the sensor layer PSL. In such an embodiment, a barrier layer BRL may be disposed between the first substrate SUB1 and the second substrate SUB2.

The second substrate SUB2 may be formed of the same or different material as the first substrate SUB1. For example, both of the first substrate SUB1 and the second substrate SUB2 may be a thin film substrate of polyimide ("PI") material. Alternatively, the first substrate SUB1 and the second substrate SUB2 may be a heterogeneous substrate including different materials. The second substrate SUB2 may include at least one material previously referred to as a configuration material of the first substrate SUB1, and may be formed of other various materials.

The barrier layer BRL may be provided in a form of a single layer or a multilayer. For example, the barrier layer BRL may be formed of a structure in which at least ten or more inorganic insulating layers are stacked.

Figure 8:
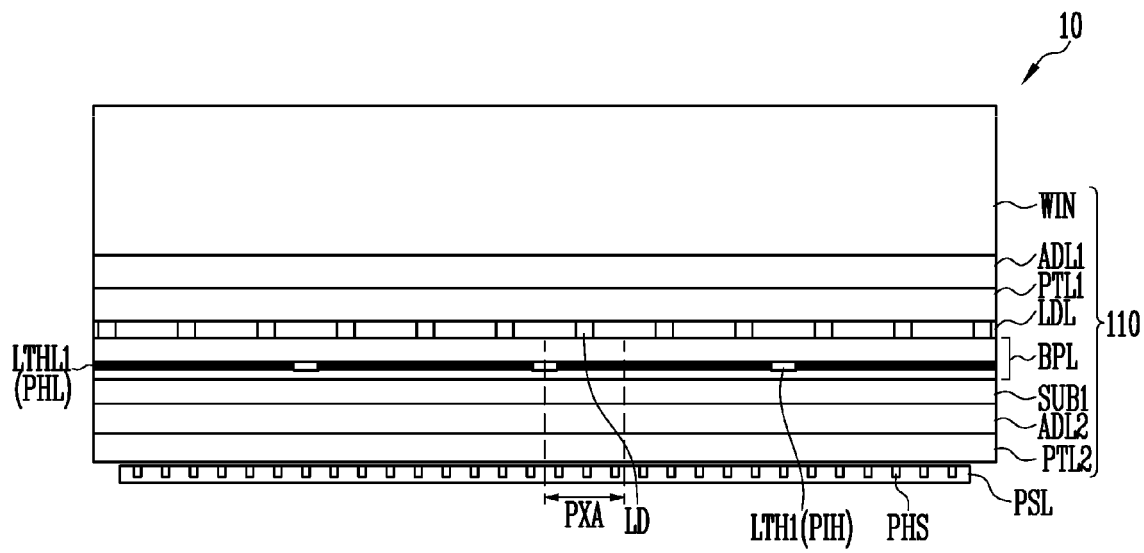

Referring to FIG. 8, the circuit element layer BPL may include a light transmission hole array layer LTHL disposed in the sensing area SA. For example, the light transmission hole array layer LTHL may include a plurality of first light transmission holes LTH1 distributed in the circuit element layer BPL. In such an embodiment, the light transmission hole array layer LTHL may be provided instead of the light shielding layer PHL. That is, the first light transmission holes LTH1 may function as the pinholes PIH, respectively.

When the pinhole PIH is formed by using the plurality of first light transmission holes LTH1 distributed in the circuit element layer BPL without separately providing the light shielding layer PHL as shown in FIG. 8, a separate mask process for forming the light shielding layer PHL may be omitted. In addition, the display device 10 according to the embodiment shown in FIG. 8 may prevent a thickness increase due to the separate provision of the light shielding layer PHL, thereby reducing manufacturing costs, and increasing process efficiency.

In addition, when the pinhole PIH is provided in the circuit element layer BPL as shown in FIG. 8, since the distance between the pinholes PIH and the optical opening area OPA described with reference to FIG. 4A is reduced, the width of the optical opening area OPA may be reduced. Then, since a size of the pixel area PXA may be reduced, the display device 10 of high resolution may be realized.

Figure 9:
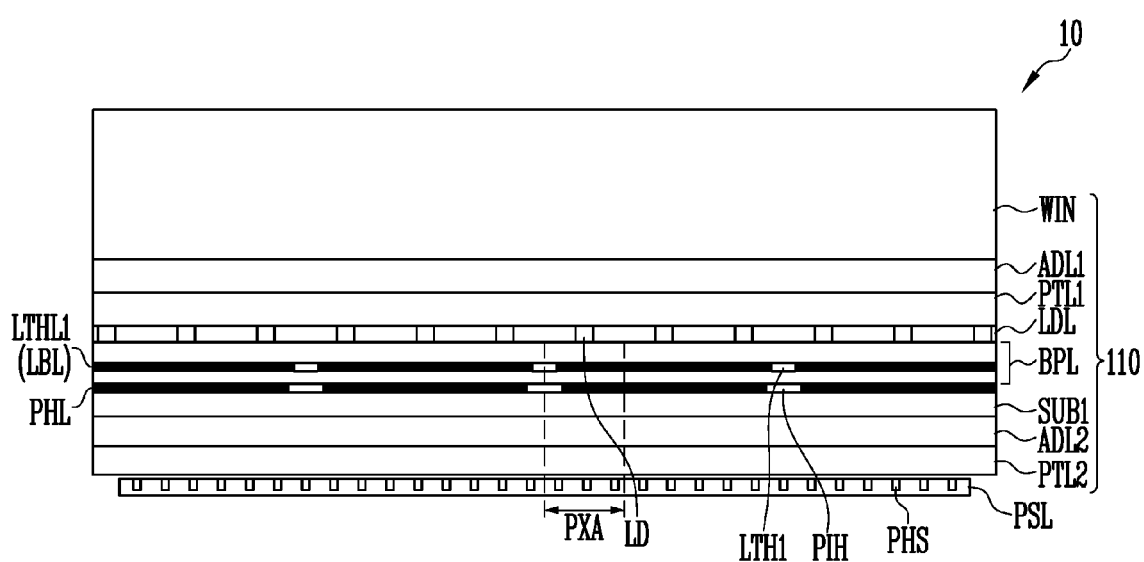
Figure 10:
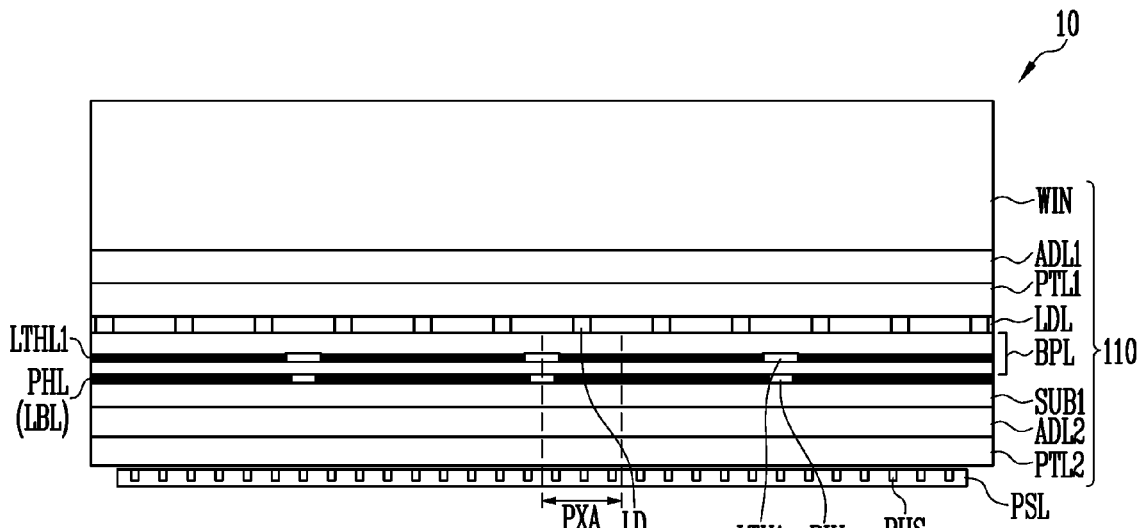

Referring to FIGS. 9 and 10, the circuit element layer BPL may include a first light transmission hole array layer LTHL1 including a plurality of first light transmission holes LTH1. In addition, the light shielding layer PHL including the plurality of pinholes PIH may be disposed between the first substrate SUB1 and the circuit element layer BPL. Each first light transmission hole LTH1 and each pinhole PIH are disposed so that at least portions thereof overlap.

In various exemplary embodiments of the invention, the first light transmission holes LTH1 and the pinholes PIH may have the same or different sizes. For example, the first light transmission holes LTH1 may have a width (or diameter) smaller than that of the pinholes PIH, as shown in FIG. 9. For example, the pinholes PIH and the first light transmission holes LTH1 may have a width (or diameter) of a range of about 5 μm to about 20 μm, and the width (or diameter) of the first transmission hole LTH1 may have a width smaller than that of the pinholes PIH.

In an embodiment, when the pinholes PIH and the first light transmission holes LTH1 have a generally rectangular shape, a length of a first side of the pinholes PIH may be about 8.5 μm, and a length of a second side perpendicular to the first side may be about 9.4 μm. In addition, in such an embodiment, a length of a first side of the first light transmission holes LTH1 may be about 4.5 μm, and a length of a second side perpendicular to the first side may be about 5.4 μm. Such numerical values are merely an example, and the exemplary embodiments of the invention are not limited thereto.

In the embodiment in which the first light transmission holes LTH1 have a size smaller than that of the pinholes PIH, the first light transmission hole array layer LTHL1 may perform a function of the light control layer LBL controlling the path of the light (for example, limiting the field of view of the reflection light to a predetermined angle range), and the light shielding layer PHL may perform a light blocking function.

The first light transmission holes LTH1 may have a width (or diameter) larger than that of the pinholes PIH as shown in FIG. 10. In such an embodiment, the first light transmission hole array layer LTHL1 may perform a light blocking function and the light shielding layer PHL may perform the function of the light control layer LBL controlling the path of the light.

Figure 11:
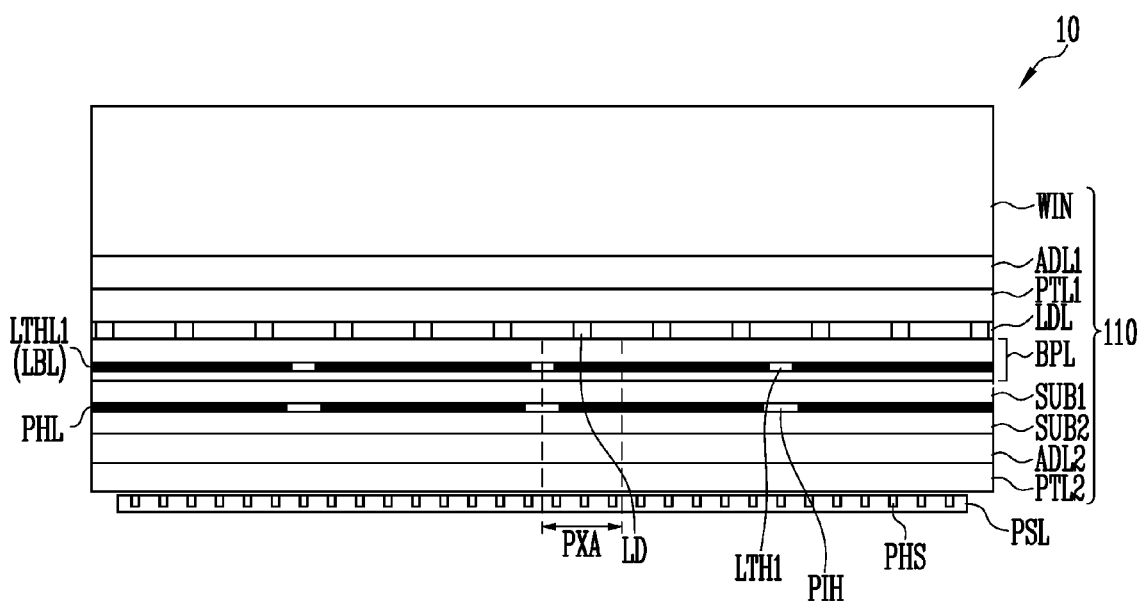

Referring to FIG. 11, the circuit element layer BPL may include the first light transmission hole array layer LTHL1 including the plurality of first light transmission holes LTH1. In addition, the light shielding layer PHL including the plurality of pinholes PIH may be disposed between the first substrate SUB1 and the circuit element layer BPL. Each first light transmission hole LTH1 and each pinhole PIH are disposed so that at least portions thereof overlap.

In various exemplary embodiments of the invention, the first light transmission holes LTH1 and the pinholes PIH may have the same or different sizes. For example, the first light transmission holes LTH1 may have a width (or diameter) smaller than that of the pinholes PIH. In such an embodiment, the first light transmission hole array layer LTHL1 may perform the function of the light control layer LBL controlling the path of the light, and the light shielding layer PHL may perform the light blocking function.

Figure 12A:
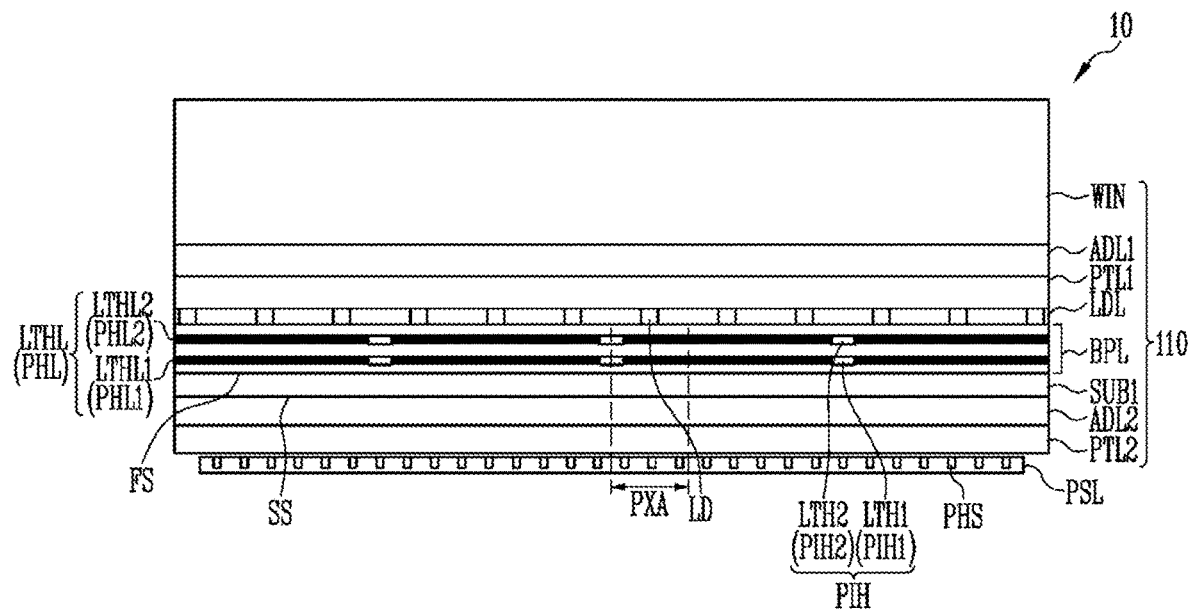
Figure 12B:
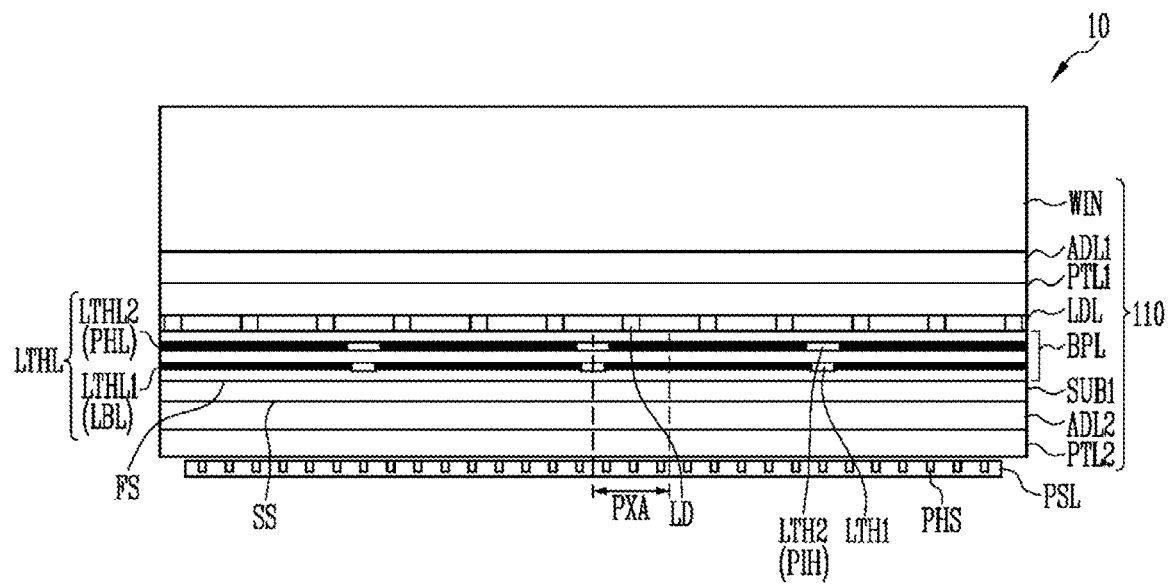
Figure 12C:
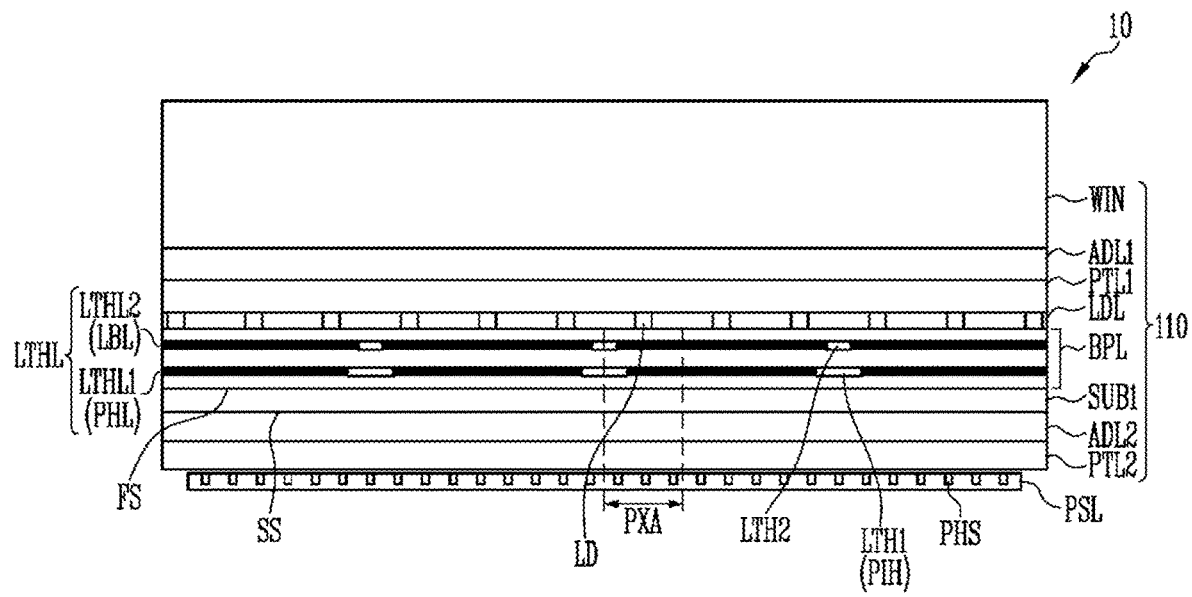

Referring to FIGS. 12A to 12C, the first substrate (SUB1) may have a first surface (FS) and a second surface (SS), and the circuit element layer BPL may include the light transmission hole array layer LTHL disposed in the sensing area SA. The light transmission hole array layer LTHL may be formed of a multilayer. For example, the light transmission hole array layer LTHL includes a first light transmission hole array layer LTHL1 including first light transmission holes LTH1 and a second light transmission hole array layer LTHL2 including second light transmission holes LTH2. The first light transmission hole array layer LTHL1 may be a first layer (for example, a first conductive layer) of the circuit element layer BPL and the second light transmission hole array layer LTHL2 may be a second layer (for example, a second conductive layer).

The first light transmission holes LTH1 and the second light transmission holes LTH2 may overlap with each other.

The first light transmission holes LTH1 and the second light transmission holes LTH2 may have the same or different sizes.

For example, as shown in FIG. 12A, the first and second light transmission holes LTH1 and LTH2 may have substantially the same width (or diameter) and may be disposed so as to overlap with each other. In such an embodiment, the first and second light transmission holes LTH1 and LTH2 may form the pinholes PIH of a multilayer structure. For example, the first light transmission holes LTH1 may form first pinholes PIH1 disposed in the first layer of the circuit element layer BPL and the second light transmission holes LTH2 may form the second pinholes PIH2 disposed in the second layer of the circuit element layer BPL. In this case, the first light transmission hole array layer LTHL1 including the first light transmission holes LTH1 and the second light transmission hole array layer LTHL2 including the second light transmission holes LTH2 may form the light shielding layer PHL of a multilayer structure.

As shown in FIG. 12B, the first light transmission holes LTH1 may have a size smaller than that of the second light transmission holes LTH2. In such an embodiment, the first light transmission hole array layer LTHL1 including the first light transmission holes LTH1 may perform the function of the light control layer LBL controlling the path of the light, and the second transmission hole array layer LTHL2 including the second light transmission holes LTH2 may replace the light shielding layer PHL performing the light blocking function.

As shown in FIG. 12C, the first light transmission holes LTH1 may have a size larger than that of the second light transmission holes LTH2. In such an embodiment, the first light transmission hole array layer LTHL1 including the first light transmission holes LTH1 may replace the light shielding layer PHL performing the light blocking function, and the second transmission hole array layer LTHL2 including the second light transmission holes LTH2 may perform the function of the light control layer LBL controlling the path of the light.

Figure 13:
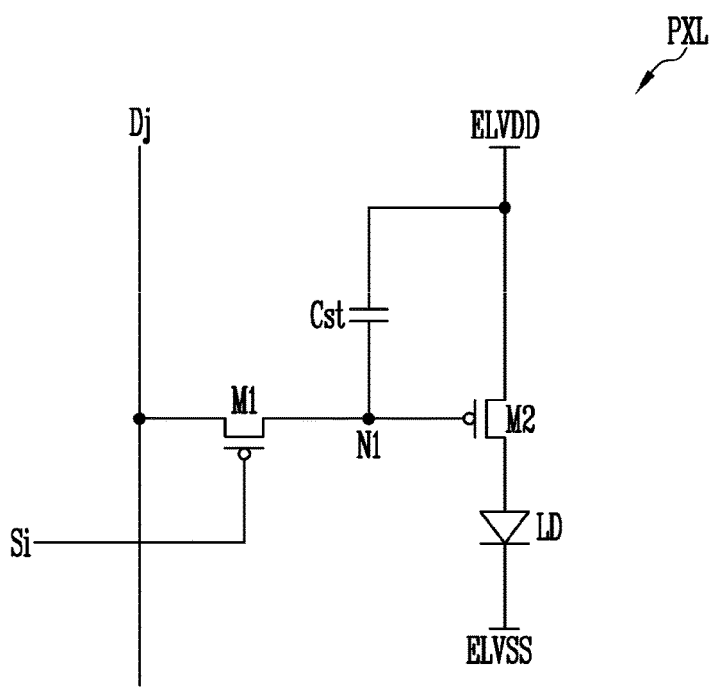
FIG. 13 is a circuit diagram illustrating an exemplary embodiment of a representative pixel.

FIG. 13 is a circuit diagram illustrating an exemplary embodiment of a representative pixel. In FIG. 13, for convenience of description, an active type pixel connected to an i-th (i is a natural number) scan line Si that is disposed in an i-th horizontal pixel column and a j-th (j is a natural number) data line Dj that is disposed in a j-th vertical pixel column and including two transistors is shown. However, the structure of the pixel PXL in the exemplary embodiments of the invention is not limited to the structure shown in FIG. 13.

Referring to FIG. 13, the pixel PXL may include a first transistor M1, a second transistor M2, a storage capacitor Cst, and a light emitting element LD.

The first transistor M1 (driving transistor) is connected between the j-th data line Dj and a first node N1 and a gate electrode of the first transistor M1 is connected to the scan line Si. The first transistor M1 is turned on when a scan signal having a gate-on voltage (for example, a low voltage) is supplied from the scan line Si. When the first transistor M1 is turned on, the j-th data line Dj and the first node N1 may be electrically connected with each other.

The second transistor M2 (switching transistor) is connected between first power ELVDD and the light emitting element LD and a gate electrode of the second transistor M2 is connected to the first node N1. The second transistor M2 controls an amount of a current supplied from the first power ELVDD to second power ELVSS through the light emitting element LD corresponding to a voltage of the first node N1.

In various embodiments, the first power ELVDD may be a high potential pixel power and the second power ELVSS may be a low potential pixel power.

The storage capacitor Cst is connected between the first power ELVDD and the first node N1. The storage capacitor Cst may store a voltage corresponding to a data signal supplied to the first node N1.

The light emitting element LD is connected between the second transistor M2 and the second power ELVSS. The light emitting element LD emits light at a luminance corresponding to the current controlled by the second transistor M2. In various embodiments, the light emitting element LD may be an organic light emitting diode ("OLED").

Figure 14:
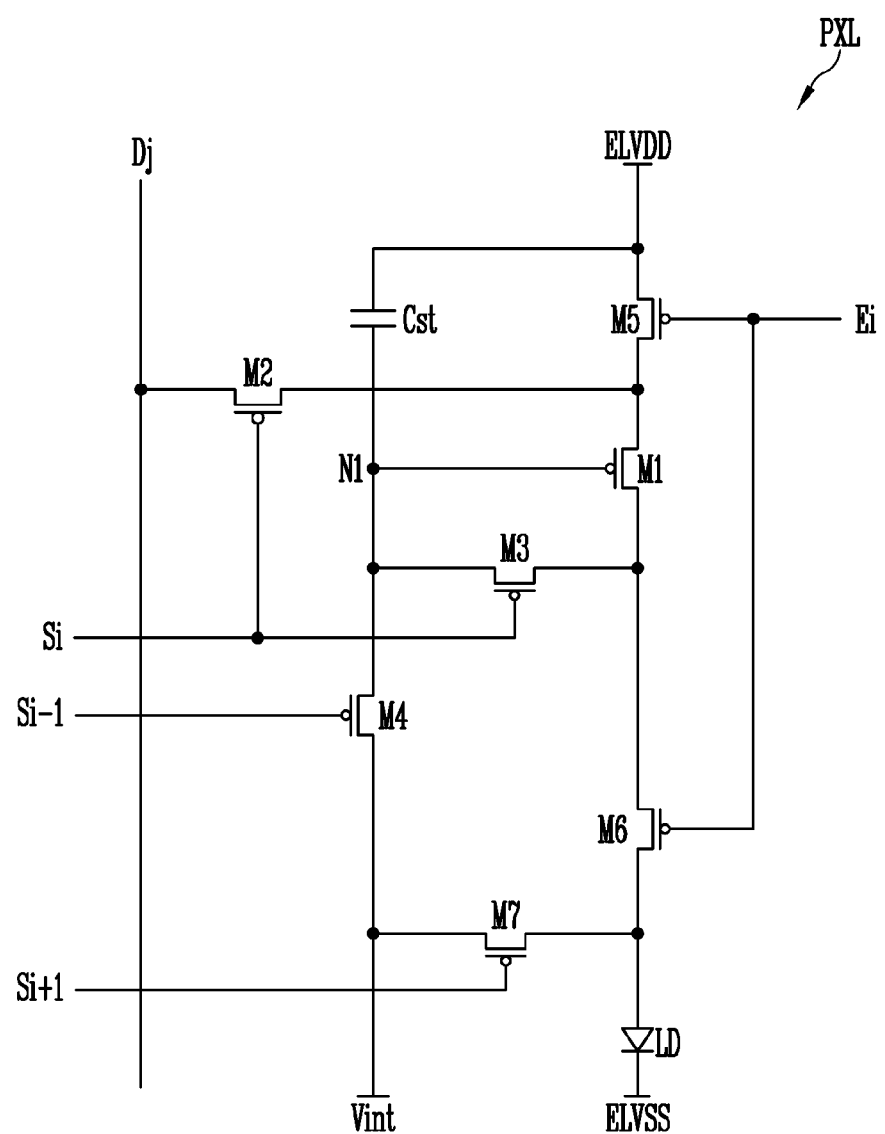
FIG. 14 is a circuit diagram illustrating another exemplary embodiment of a representative pixel.

FIG. 14 is a circuit diagram illustrating another exemplary embodiment of a representative pixel. In FIG. 14, for convenience of description, an active type pixel connected to an i-th (i is a natural number) scan line Si that is disposed in an i-th horizontal pixel column and a j-th (j is a natural number) data line Dj that is disposed in a j-th vertical pixel column and including seven transistors is shown. However, the structure of the pixel PXL in the exemplary embodiments of the invention is not limited to the structure shown in FIG. 7.

Referring to FIG. 14, a pixel PXL according to another embodiment may include first to seventh transistors M1 to M7, a storage capacitor Cst, and a light emitting element LD.

A first electrode of the first transistor M1 may be connected to first power ELVDD through the fifth transistor M5 and a second electrode of the first transistor M1 may be connected to an anode electrode the light emitting element LD through the sixth transistor M6. In addition, a gate electrode of the first transistor M1 may be connected to a first node N1. The first transistor M1 may control an amount of a current flowing from the first power ELVDD to second power ELVSS through the light emitting element LD corresponding to a voltage of the first node N1.

The second transistor M2 (switching transistor) may be connected between the j-th data line Dj and the first electrode of the first transistor M1. In addition, a gate electrode of the second transistor M2 may be connected to the i-th scan line Si. The second transistor M2 may be turned on when a scan signal is supplied to the i-th scan line Si to electrically connect the j-th data line Dj and the first electrode of the first transistor M1 with each other.

The third transistor M3 may be connected between the second electrode of the first transistor M1 and the first node N1. In addition, a gate electrode of the third transistor M3 may be connected to the i-th scan line Si. The third transistor M3 may be turned on when a scan signal of a gate-on voltage is supplied to the i-th scan line Si to electrically connect the second electrode of the first transistor M1 and the first node N1 with each other. Therefore, when the third transistor M3 is turned on, the first transistor M1 may be connected in a diode form.

The fourth transistor M4 (initialization transistor) may be connected between the first node N1 and initialization power Vint. In addition, a gate electrode of the fourth transistor M4 may be connected to an (i−1)-th scan line Si−1. The fourth transistor M4 may be turned on when a scan signal is supplied to the (i−1)-th scan line Si−1 to supply a voltage of the initialization power Vint to the first node N1.

FIG. 14 illustrates an embodiment in which the (i−1)-th scan line Si−1 is used as an initialization control line for initializing a gate node of the first transistor M1, that is, the first node N1. However, the exemplary embodiments of the invention are not limited thereto. For example, in another embodiment, another control line such as an (i−2)-th scan line Si−2 may be used as the initialization control line for initializing the gate node of the first transistor M1.

The fifth transistor M5 may be connected between the first power ELVDD and the first transistor M1. In addition, a gate electrode of the fifth transistor M5 may be connected to an i-th light emitting control line Ei. The fifth transistor M5 may be turned off when a light emitting control signal of a gate-off voltage is supplied to the i-th light emitting control line Ei, and may be turned on in other cases.

The sixth transistor M6 may be connected between the first transistor M1 and the light emitting element LD. In addition, a gate electrode of the sixth transistor M6 may be connected to the i-th light emitting control line Ei. The sixth transistor M6 may be turned off the light emitting control signal of the gate-off voltage is supplied to the i-th light emitting control line Ei, and may be turned on in other cases.

The seventh transistor M7 may be connected between the initialization power Vint and a first electrode of the light emitting element LD, for example, an anode electrode. In addition, a gate electrode of the seventh transistor M7 may be connected to an (i+1)-th scan line Si+1. The seventh transistor may be turned on when a scan signal of a gate-on voltage (for example, a low level voltage) is supplied to the (i+1)-th scan line Si+1 to supply the voltage of the initialization power Vint to the anode electrode of the light emitting element LD. Here, the voltage of the initialization power Vint may be set to a voltage lower than the data signal. That is, the voltage of the initialization power Vint may be set to be equal to or less than a lowest voltage of the data signal.

FIG. 14 shows a case in which an anode initialization control line to which the gate electrode of the seventh transistor M7 is connected is the (i+1)-th scan line Si+1. However, the exemplary embodiments of the invention are not limited thereto. For example, in another embodiment, the gate electrode of the seventh transistor M7 may be connected to the i-th scan line Si. In this case, the voltage of the initialization power Vint may be supplied to the anode electrode of the light emitting element LD through the seventh transistor M7 when the scan signal of the gate-on voltage is supplied to the i-th scan line Si.

The storage capacitor Cst may be connected between the first power ELVDD and the first node N1. The storage capacitor Cst may store a voltage corresponding to the data signal and a threshold voltage of the first transistor M1.

The anode electrode of the light emitting element LD may be connected to the first transistor M1 through the sixth transistor M6 and a cathode electrode may be connected to the second power ELVSS. The light emitting element LD generates light of a predetermined luminance corresponding to the amount of the current supplied from the first transistor M1. A voltage value of the first power ELVDD may be set to be higher than a voltage value of the second power ELVSS so that the current may flow to the light emitting element LD.

On the other hand, the structure of the pixel PXL is not limited to the embodiment shown in FIG. 14. For example, the currently known pixel circuits of various structures may be applied to the pixel PXL.

Figure 15:
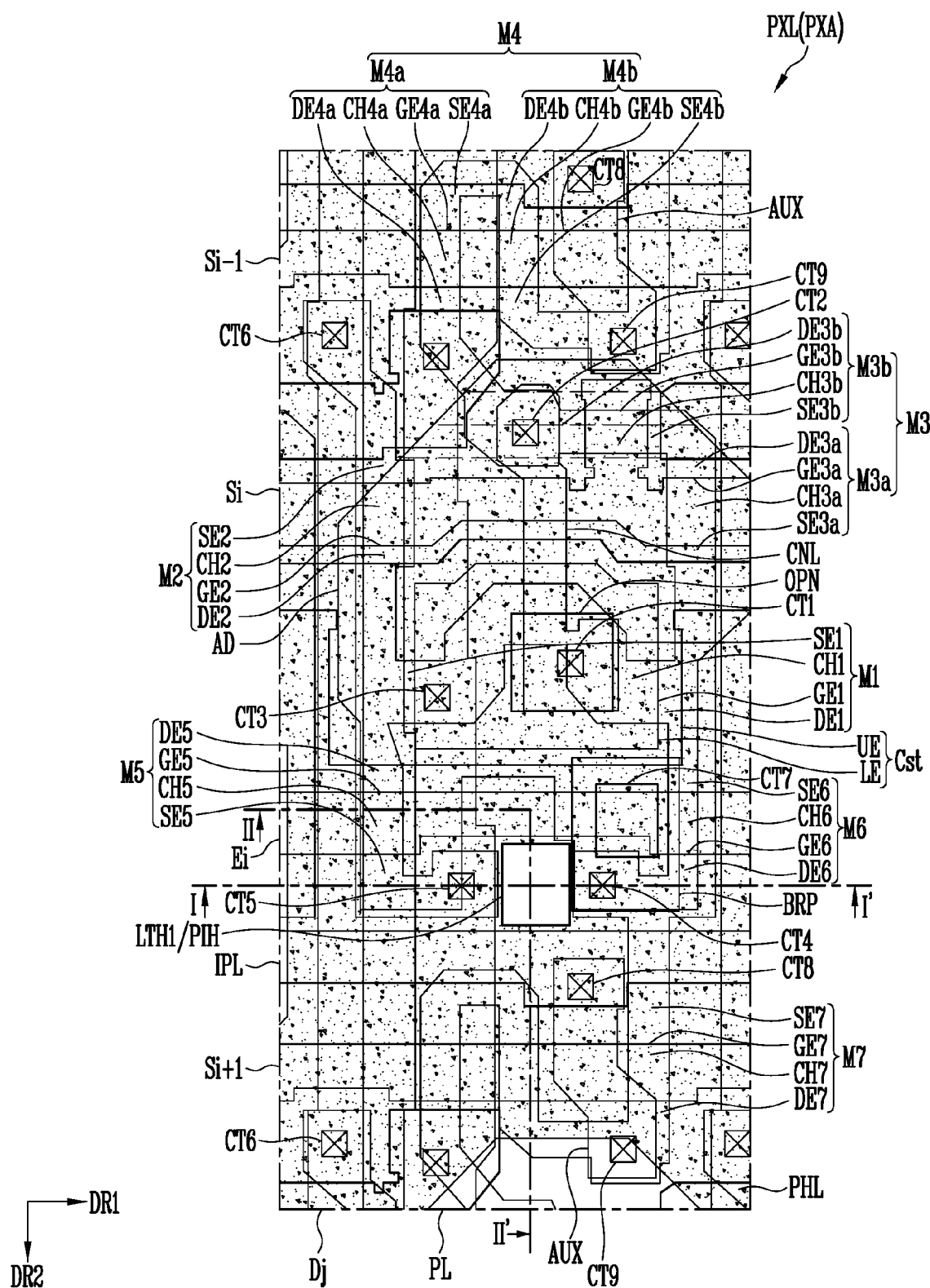
FIG. 15 is a plan view illustrating an exemplary embodiment of the layout of the pixel shown in FIG. 14.
Figure 16:
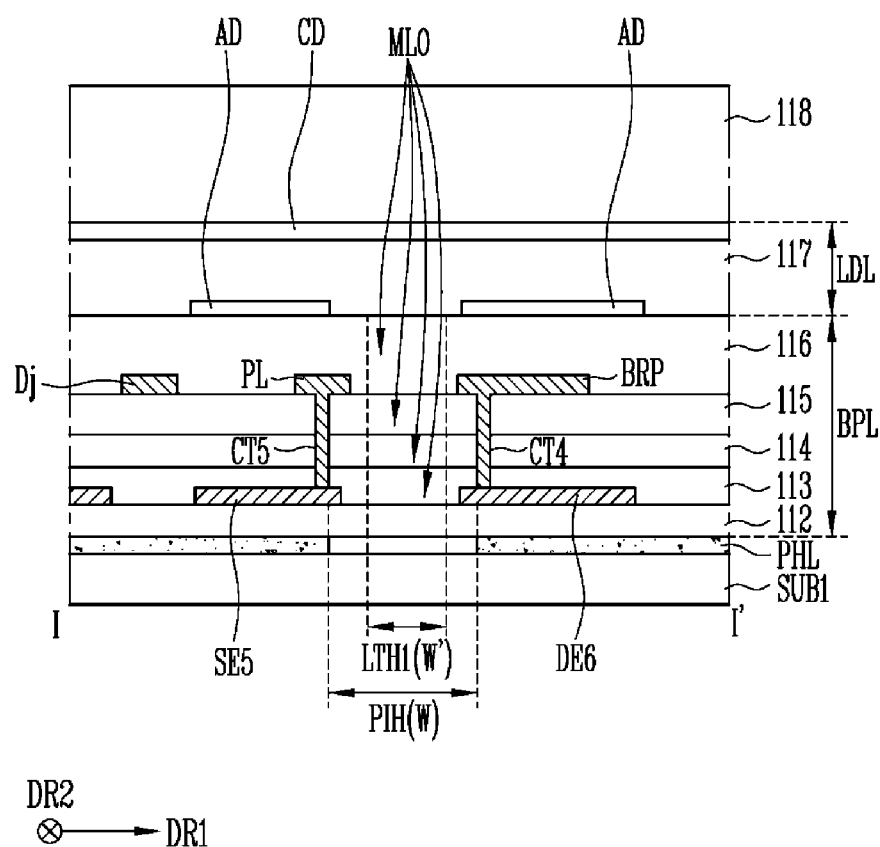
FIG. 16 is a cross-sectional view taken along a line I-I' of FIG. 15.
Figure 17:
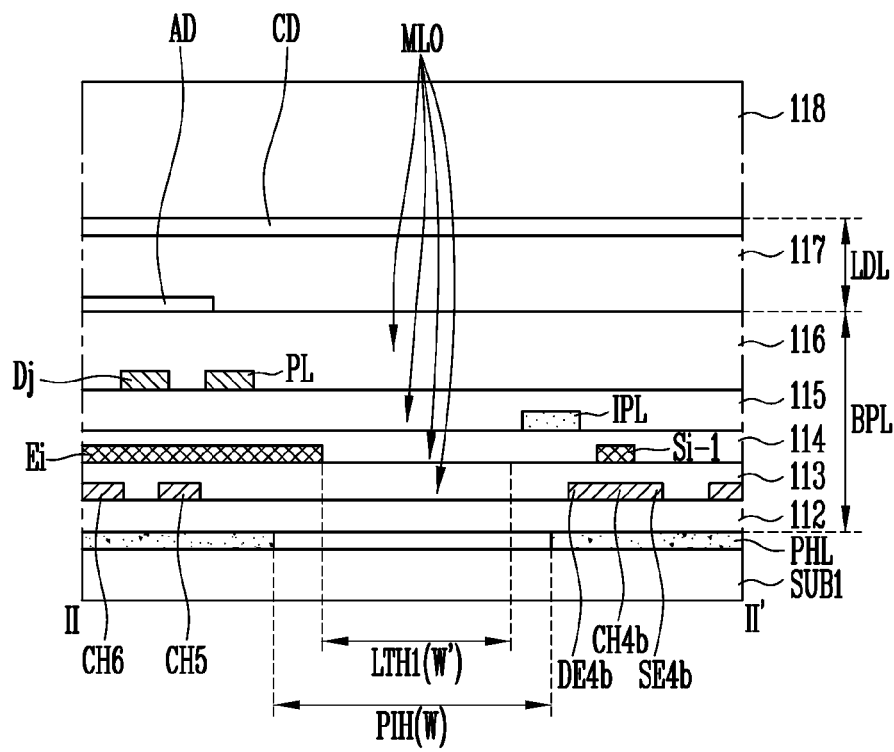
FIG. 17 is a cross-sectional view taken along a line II-II' of FIG. 15.

FIG. 15 is a plan view illustrating an exemplary embodiment of the layout of the pixel shown in FIG. 14. Specifically, FIG. 15 shows a layout of the pixel PXL including the first transmission hole LTH1 shown in FIGS. 8 to 12C among pixels PXL disposed in the display area AA of FIGS. 1 and 2. FIG. 16 is a cross-sectional view taken along a line I-I' of FIG. 15. FIG. 17 is a cross-sectional view taken along a line II-II' of FIG. 15. For convenience of description, FIGS. 15 to 17 shows only the circuit element layer BPL to avoid redundancy, the light emitting element layer LDL, and the first protective layer PTL1 in the display device 10 shown in FIGS. 4A and 4B.

In describing an embodiment of FIGS. 15 to 17, for convenience, a scan line of an (i−1)-th row is referred to as an "(i+1)-th scan line (Si+1)", a light emitting control line of an i-th row is referred to as a "light emitting control line Ei", a data line of a j-th column is referred to as a "data line Dj", and a power line of the j-th column, for example, a power line of the j-th column, to which first power ELVDD is applied, is referred to as a "power line PL".

Referring to FIGS. 15 to 17 with the embodiments described above, the display device 10 may include the pixels PXL disposed in the display area AA and a wire portion for supplying the driving signals and/or power to the pixels PXL. The wire portion may include the scan lines Si−1, Si, and Si+1, the data line Dj, the light emitting control line Ei, the power line PL, and an initialization power line IPL.

The scan lines Si−1, Si, and Si+1 may extend in a first direction DR1 in the display area AA. The scan lines Si−1, Si, and Si+1 may include the (i−1)-th scan line Si−1, the i-th scan line Si, and the (i+1)-th scan line Si+1 that are sequentially arranged along a second direction DR2 intersecting the first direction DR1. The scan lines Si−1, Si, and Si+1 may receive scan signals. For example, the (i+1)-th scan line Si−1 may receive an (i−1)-th scan signal, the i-th scan line Si may receive an i-th scan signal, and the (i+1)-th scan line Si+1 may receive an (i+1)-th scan signal.

The light emitting control line Ei may extend in the first direction DR1 so as to be parallel to the scan lines Si−1, Si, and Si+1 in the display area AA. The light emitting control line Ei may receive a light emitting control signal.

The data line Dj may extend in the second direction DR2 in the display area AA. That is, the data line Dj may extend in a direction intersecting control lines Si−1, Si, Si+1, and Ei including the scan lines Si−1, Si, and Si+1 and the light emitting control line Ei. The data line Dj may receive a data signal.

The power line PL may extend along the second direction DR2 in the display area AA, but is not limited thereto. The power line PL may be disposed to be spaced apart from the data line Dj and may receive the first power ELVDD.

The initialization power line IPL may extend along the first direction DR1 in the display area AA, but is not limited thereto. The initialization power line IPL may receive the initialization power Vint.

In an embodiment, the pixel PXL may include the first to seventh transistors M1 to M7, the storage capacitor Cst, and the light emitting element LD.

The first transistor M1 may include a first gate electrode GE1, a first source electrode SE1, and a first drain electrode DE1.

In an embodiment, the first gate electrode GE1 may be disposed so as to overlap a first channel CH1 of the active pattern, with at least one insulating layer, for example the gate insulating layer 113 interposed therebetween. The first gate electrode GE1 may be connected to a third drain electrode DE3 (including DE3a and DE3b) of the third transistor M3 and a fourth source electrode SE4 (including SE4a and SE4b) of the fourth transistor M4.

The first gate electrode GE1 may be connected to the third drain electrode DE3 and the fourth source electrode SE4 by the connection wire CNL. One end of the connection line CNL may be connected to the first gate electrode GE1 through a first contact hole CT1 and the other end may be connected to the third drain electrode DE3 and the fourth source electrode SE4 through a second contact hole CT2.

In an embodiment, the first channel CH1, the first source electrode SE1, and the first drain electrode DE1 may be formed of a semiconductor pattern in which an impurity is not doped or an impurity is doped. For example, the first source electrode SE1 and the first drain electrode DE1 may be formed of a semiconductor pattern doped with an impurity, and the first channel CH1 may be formed of a semiconductor pattern in which an impurity is not doped.

The first channel CH1 has a shape extending in a random direction and may have a shape bent several times along the extended longitudinal direction. The first channel CH1 may overlap the first gate electrode GE1 when viewed in a plan view. A channel region of the first transistor M1 may be formed to be long by forming the first channel CH1 to be long. Therefore, a driving range of a gate voltage applied to the first transistor M1 is widened. Thus, a grayscale of the light emitted from the light emitting element LD may be finely controlled.

The first source electrode SE1 may be connected to one end of the first channel CH1. The first source electrode SE1 may be connected to a second drain electrode DE2 of the second transistor M2 and a fifth drain electrode DE5 of the fifth transistor M5. In an embodiment, the first drain electrode DE1 may be connected to the other end of the first channel CH1. The first drain electrode DE1 may be connected to a third source electrode SE3 (including SE3$a$ and SE3$b$) of the third transistor M3 and a sixth source electrode SE6 of the sixth transistor M6.

The second transistor M2 may include a second gate electrode GE2, a second channel CH2, a second source electrode SE2, and a second drain electrode DE2.

The second gate electrode GE2 may be disposed so as to overlap a second channel CH2, with at least one insulating layer, for example, the gate insulating layer 113 interposed therebetween. The second gate electrode GE2 may be connected to the i-th scan line Si.

The second channel CH2, the second source electrode SE2, and the second drain electrode DE2 may be formed of a semiconductor pattern in which an impurity is not doped or an impurity is doped. For example, the second source electrode SE2 and the second drain electrode DE2 may be formed of a semiconductor pattern in which an impurity is doped, and the second channel CH2 may be formed of a semiconductor pattern in which an impurity is not doped. The second channel CH2 may correspond to a portion overlapping the second gate electrode GE2.

One end of the second source electrode SE2 may be connected to the second channel CH2 and the other end of the second source electrode SE2 may be connected to the data line Dj through a sixth contact hole CT6. In an embodiment, one end of the second drain electrode DE2 may be connected to the second channel CH2 and the other end of the second drain electrode DE2 may be connected to the first source electrode SE1 of the first transistor M1 and the fifth drain electrode DE5 of the fifth transistor M5.

The third transistor M3 may be provided with a double gate structure to prevent a leakage current. That is, the third transistor M3 may include 3a-th transistor M3$a$ and a 3b-th transistor M3$b$. The 3a-th transistor M3$a$ may include a 3a-th gate electrode GE3$a$, a 3a-th active pattern, a 3a-th source electrode SE3$a$, and a 3a-th drain electrode DE3$a$. The 3b-th transistor M3$b$ may include a 3b-th gate electrode GE3$b$, a 3b-th active pattern, a 3b-th source electrode SE3$b$, and a 3b-th drain electrode DE3$b$. Hereinafter, the 3a-th gate electrode GE3$a$ and the 3b-th gate electrode GE3$b$ are referred to as a third gate electrode GE3, the 3a-th active pattern and the 3b-th active pattern are referred to as a third channel CH3, the 3a-th source electrode SE3$a$ and the 3b-th source electrode SE3$b$ are referred to as a third source electrode SE3, and the 3a-th drain electrode DE3$a$ and the 3b-th drain electrode DE3$b$ are referred to as a third drain electrode DE3.

The third gate electrode GE3 (including GE3$a$ and GE3$b$) may be disposed so as to overlap a third channel CH3, with at least one insulating layer, for example, the gate insulating layer 113 interposed therebetween. The third gate electrode GE3 may be connected to the i-th scan line Si.

The third channel CH3, the third source electrode SE3, and the third drain electrode DE3 may be formed of a semiconductor pattern in which an impurity is not doped or the impurity is doped. For example, the third source electrode SE3 and the third drain electrode DE3 may be formed of a semiconductor pattern in which an impurity is doped, and the third channel CH3 may be formed of a semiconductor pattern in which an impurity is not doped. The third channel CH3 corresponds to a portion overlapping the third gate electrode GE3.

One end of the third source electrode SE3 may be connected to the third channel CH3 (including CH3$a$ and CH3$b$) and the other end of the third source electrode SE3 may be connected to the first drain electrode DE1 of the first transistor M1 and the sixth source electrode SE6 of the sixth transistor M6. In an embodiment, one end of the third drain electrode DE3 may be connected to the third channel CH3 and the other end of the third drain electrode DE3 may be connected to the fourth source electrode SE4 of the fourth transistor M4. In addition, the third drain electrode DE3 may be connected to the first gate electrode GE1 of the first transistor M1 through the connection line CNL, the second contact hole CT2, and the first contact hole CT1.

The fourth transistor M4 may be provided with a double gate structure to prevent a leakage current. That is, the fourth transistor M4 may include 4a-th transistor M4$a$ and a 4b-th transistor M4$b$. The 4a-th transistor M4$a$ may include a 4a-th gate electrode GE4$a$, a 4a-th active pattern, a 4a-th source electrode SE4$a$, and a 4a-th drain electrode DE4$a$. The 4b-th transistor M4$b$ may include a 4b-th gate electrode GE4$b$, a 4b-th active pattern, a 4b-th source electrode SE4$b$, and a 4b-th drain electrode DE4$b$. Hereinafter, the 4a-th gate electrode GE4$a$ and the 4b-th gate electrode GE4$b$ are referred to as a fourth gate electrode GE4 (including GE4$a$ and GE4$b$), the 4a-th active pattern and the 4b-th active pattern are referred to as a fourth channel CH4 (including CH4$a$ and CH4$b$), the 4a-th source electrode SE4$a$ and the 4b-th source electrode SE4$b$ are referred to as a fourth source electrode SE4, and the 4a-th drain electrode DE4$a$ and the 4b-th drain electrode DE4$b$ are referred to as a fourth drain electrode DE4.

The fourth gate electrode GE4 may be disposed so as to overlap a fourth channel CH4, with at least one insulating layer, for example, the gate insulating layer 114 interposed therebetween. The fourth gate electrode GE4 may be connected to the (i−1)-th scan line Si−1.

The fourth channel CH4, the fourth source electrode SE4, and the fourth drain electrode DE4 may be formed of a semiconductor pattern in which an impurity is not doped or an impurity is doped. For example, the fourth source electrode SE4 and the fourth drain electrode DE4 may be formed of a semiconductor pattern in which an impurity is doped, and the fourth channel CH4 may be formed of a semiconductor pattern in which an impurity is not doped. The fourth channel CH4 corresponds to a portion overlapping the fourth gate electrode GE4.

One end of the fourth source electrode SE4 may be connected to the fourth channel CH4 and the other end of the fourth source electrode SE4 may be connected to the third drain electrode DE3 of the third transistor M3. In addition, the fourth source electrode SE4 may be connected to the first gate electrode GE1 of the first transistor M1 through the connection line CNL, the second contact hole CT2, and the first contact hole CT1. One end of the fourth drain electrode DE4 may be connected to the fourth channel CH4 and the other end of the fourth drain electrode DE4 may be connected to a seventh drain electrode DE7 of the seventh transistor M7 of the pixel PXL of the (i−1)-th row. The fourth drain electrode DE4 may be connected to the initialization power line IPL through an auxiliary connection wire AUX, a ninth contact hole CT9, and an eighth contact hole CTB.

The fifth transistor M5 may include a fifth gate electrode GE5, a fifth channel CH5, a fifth source electrode SE5, and a fifth drain electrode DE5.

The fifth gate electrode GE5 may be disposed so as to overlap the fifth channel CH5, with at least one insulating layer, for example, the gate insulating layer 113 interposed therebetween. The fifth gate electrode GE5 may be connected to the light emitting control line Ei.

The fifth channel CH5, the fifth source electrode SE5, and the fifth drain electrode DE5 may be formed of a semiconductor pattern in which an impurity is not doped or an impurity is doped. For example, the fifth source electrode SE5 and the fifth drain electrode DE5 may be formed of a semiconductor pattern in which an impurity is doped, and the fifth channel CH5 may be formed of a semiconductor pattern in which an impurity is not doped. The fifth channel CH5 corresponds to a portion overlapping the fifth gate electrode GE5.

One end of the fifth source electrode SE5 may be connected to the fifth channel CH5 and the other end of the fifth source electrode SE5 may be connected to the power line PL through a fifth contact hole CT5. In an embodiment, one end of the fifth drain electrode DE5 may be connected to the fifth channel CH5 and the other end of the fifth drain electrode DE5 may be connected to the first source electrode SE1 of the first transistor M1 and the second drain electrode DE2 of the second transistor M2.

The sixth transistor M6 may include a sixth gate electrode GE6, a sixth channel CH6, the sixth source electrode SE6, and a sixth drain electrode DE6.

The sixth gate electrode GE6 may be disposed so as to overlap the sixth channel CH6, with at least one insulating layer, for example, the gate insulating layer 113 interposed therebetween. The sixth gate electrode GE6 may be connected to the light emitting control line Ei.

The sixth channel CH6, the sixth source electrode SE6, and the sixth drain electrode DE6 are formed of a semiconductor pattern in which an impurity is not doped or an impurity is doped. For example, the sixth source electrode SE6 and the sixth drain electrode DE6 may be formed of a semiconductor pattern in which an impurity is doped, and the sixth channel CH6 may be formed of a semiconductor pattern in which an impurity is not doped. The sixth channel CH6 corresponds to a portion overlapping the sixth gate electrode GE6.

One end of the sixth source electrode SE6 may be connected to the sixth channel CH6 and the other end of the sixth source electrode SE6 may be connected to the first drain electrode DE1 of the first transistor M1 and the third source electrode SE3 of the third transistor M3. In an embodiment, one end of the sixth drain electrode DE6 may be connected to the sixth channel CH6 and the other end of the sixth drain electrode DE6 may be connected to the seventh source electrode SE7 of the seventh transistor M7.

The seventh transistor M7 may include a seventh gate electrode GE7, a seventh channel CH7, the seventh source electrode SE7, and the seventh drain electrode DE7.

The seventh gate electrode GE7 may be disposed so as to overlap the seventh channel CH7, with at least one insulating layer, for example, the gate insulating layer 113 interposed therebetween. The seventh gate electrode GE7 may be connected to the (i+1)-th scan line Si+1.

The seventh channel CH7, the seventh source electrode SE7, and the seventh drain electrode DE7 may be formed of a semiconductor pattern in which an impurity is not doped or an impurity is doped. For example, the seventh source electrode SE7 and the seventh drain electrode DE7 may be formed of a semiconductor pattern doped in which an impurity is doped, and the seventh channel CH7 may be formed of a semiconductor pattern in which an impurity is not doped. The seventh channel CH7 corresponds to a portion overlapping the seventh gate electrode GE7.

One end of the seventh source electrode SE7 may be connected to the seventh channel CH7 and the other end of the seventh source electrode SE7 may be connected to the sixth drain electrode DE6 of the sixth transistor M6. In an embodiment, one end of the seventh drain electrode DE7 may be connected to the seventh channel CH7 and the other end of the seventh drain electrode DE7 may be connected to the initialization power line IPL through the auxiliary connection wire AUX, the ninth contact hole CT9, and the eighth contact hole CTB.

The storage capacitor Cst may include a first capacitor electrode LE and a second capacitor electrode UE. In an embodiment, the first capacitor electrode LE may be a lower electrode of the storage capacitor Cst and may be formed integrally with the first gate electrode GE1 of the first transistor M1. In an embodiment, the second capacitor electrode UE may be an upper electrode of the storage capacitor Cst and may overlap the first gate electrode GE1. In addition, as viewed in plan view, the second capacitor electrode UE may cover at least one area of the first capacitor electrode LE. A capacitance of the storage capacitor Cst may be increased by enlarging the overlapping area of the first capacitor electrode LE and the second capacitor electrode UE.

The second capacitor electrode UE may extend in the first direction DR1. In an embodiment, a voltage of the same level as that of the first power ELVDD may be applied to the second capacitor electrode UE. The second capacitor electrode UE may have an opening portion OPN in an area where the first contact hole CT1 in which the first gate electrode GE1 and the connection wire CNL are in contact is formed.

The light emitting element LD may include the first electrode (for example, the anode electrode) AD, the second electrode (for example, the cathode electrode) CD, and the light emitting layer LDL provided between the first electrode AD and the second electrode CD. In an embodiment, the first electrode AD and the second electrode CD are disposed to overlap with each other in the light emitting area of the light emitting element layer LDL and the light emitting layer LDL may be formed in the light emitting area. That is, the light emitting area of each pixel PXL may be an area where the first electrode AD, the light emitting layer LDL, and the second electrode CD of the light emitting element LD overlap each other.

The first electrode AD may be provided in a predetermined light emitting area. The first electrode AD may be connected to the seventh source electrode SE7 of the seventh transistor M7 and the sixth drain electrode DE6 of the sixth transistor M6 through the fourth contact hole CT4 and the seventh contact hole CT7. The bridge pattern BRP may be provided between the fourth contact hole CT4 and the seventh contact hole CT7. The bridge pattern BRP may connect the sixth drain electrode DE6, the seventh source electrode SE7, and the first electrode AD.

Hereinafter, a stack structure (sectional structure) of a pixel PXL and a display area AA including the pixel PXL, according to an embodiment will be described.

First, the buffer layer 112 may be provided on the first surface of the first substrate SUB1.

The active pattern may be provided on the buffer layer 112. In an embodiment, the active patterns ACT may include the first to seventh channels CH1 to CH7. The first to seventh channels CH1 to CH7 may be formed of a semiconductor material.

The gate insulating layer 113 may be provided on the buffer layer 112 on which the first to seventh channels CH1 to CH7 are provided. In an embodiment, the gate insulating layer 113 may be a gate insulating film interposed between the active patterns ACT1 to ACT7 and the gate electrodes GE1 to GE7 of the transistors M1 to M7 included in the pixels PXL.

The gate insulating layer 113 may include at least one inorganic film and/or organic film. For example, the gate insulating layer 113 may be formed of an inorganic film including $SiO_x$, $SiN_x$, or the like, but is not limited thereto. For example, the gate insulating layer 113 may include an inorganic insulating material or an organic insulating material such as $SiO_x$, $SiN_x$, SiON, SiOF, or $AlO_x$, and may be a single film or a multiple film including at least one of these materials.

The first conductive layer may be disposed on the gate insulating layer 113. In an embodiment, the first conductive layer may be a first gate layer. The first conductive layer may be provided with the control lines Si−1, Si, Si+1, and Ei and the gate electrodes GE1 to GE7. In addition, one electrode of the storage capacitor Cst, for example, the first capacitor electrode LE may be provided on the first conductive layer. Specifically, the (i−1)-th scan line Si−1, the i-th scan line Si, the (i+1)-th scan line Si+1, the light emitting control line Ei, and the first to seventh gate electrodes GE1 to GE7 may be provided. In an embodiment, the first gate electrode GE1 may also be the first capacitor electrode LE of the storage capacitor Cst. That is, the first gate electrode GE1 and the first capacitor electrode LE may be integrally formed.

The control lines Si−1, Si, Si+1, and Ei, the gate electrodes GE1 to GE7, and/or the first capacitor electrode LE that is the lower electrode of the storage capacitor Cst disposed on the first conductive layer may be formed of the same material. For example, the control lines Si−1, Si, Si+1, and Ei, the gate electrodes GE1 to GE7, and/or the first capacitor electrode LE of the storage capacitor Cst may be formed of a predetermined first gate metal.

Examples of a material capable of configuring the first gate metal may include Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like, and other various metals may be used as the material capable of forming the first gate metal. Examples of an alloy capable of configuring the first gate metal may include may include MoTi, AlNiLa, and the like, and other various alloys may be used as the alloy capable of configuring the first gate metal. Examples of a multilayer film capable of forming the first gate metal may include Ti/Cu, Ti/Au, Mo/Al/Mo, ITO/Ag/ITO, TiN/Ti/Al/Ti, TiN/Ti/Cu/Ti, and the like, and other various conductive materials of a multilayer film structure may be used as the multilayer film capable of configuring the first gate metal.

On the other hand, the configuration material of the control lines Si−1, Si, Si+1, and Ei, the gate electrodes GE1 to GE7, and/or the first capacitor electrode LE is not necessarily limited to metal. That is, a material capable of providing conductivity enough to smoothly drive the pixels PXL may be used as the material forming the control lines Si−1, Si, Si+1, and Ei, the gate electrodes GE1 to GE7, and/or the first capacitor electrode LE.

For example, the control lines Si−1, Si, Si+1, and Ei, the gate electrodes GE1 to GE7, and/or the first capacitor electrode LE may be formed of a conductive polymer or a conductive metal oxide. Examples of the conductive polymer capable of configuring the control lines Si−1, Si, Si+1, and Ei, the gate electrodes GE1 to GE7, and/or the first capacitor electrode LE may include polythiophene based compound, polypyrrole based compound, polyaniline based compound, polyacetylene based compound, polyphenylene based compound, mixtures thereof, and the like, and particularly, among the polythiophene based compound compounds, PEDOT/PSS compound may be used. Examples of the conductive metal oxide capable of configuring the control lines Si−1, Si, Si+1, and Ei, the gate electrodes GE1 to GE7, and/or the first capacitor electrode LE may include ITO, IZO, AZO, ITZO, ZnO, $SnO_2$, and the like.

The first interlayer insulating layer 114 may be provided on the first conductive layer. In an embodiment, the first interlayer insulating layer 114 may be a first interlayer insulating film interposed between the first capacitor electrode LE and the second capacitor electrode UE. In an embodiment, the first interlayer insulating layer 114 may have a thickness limited to a predetermined range in order to sufficiently secure a capacity of the storage capacitor Cst within a limited area.

The first interlayer insulating layer 114 may include one or more inorganic films and/or organic films. For example, the first interlayer insulating layer 114 may be formed of an inorganic film including $SiO_x$, $SiN_x$, or the like, but is not limited thereto. For example, the first interlayer insulating layer 114 may include an inorganic insulating material or an organic insulating material such as $SiO_x$, $SiN_x$, SiON, SiOF, or $AlO_x$, and may be a single film or a multilayer film including at least one of these materials.

The second conductive layer may be disposed on the first interlayer insulating layer 114. In an embodiment, the second conductive layer may be a second gate layer.

The second conductive layer may be provided with the second capacitor electrode UE and the initialization power line IPL. In an embodiment, the second capacitor electrode UE may cover the first capacitor electrode LE. The second capacitor electrode UE overlaps the first capacitor electrode LE, with the first interlayer insulating layer 114 interposed therebetween to form the storage capacitor Cst together with the first capacitor electrode LE.

The second capacitor electrode UE and the initialization power line IPL disposed in the second conductive layer may be made of the same material. For example, the second capacitor electrode UE and the initialization power line IPL may be formed of a predetermined second gate metal. In an embodiment, the second gate metal may be one of the metal materials previously presented as the example of the first gate metal, but is not limited thereto. In addition, the configuration material of the second capacitor electrode UE and the initialization power line IPL disposed in the second conductive layer is not necessarily limited to metal. That is, a material capable of providing conductivity enough to smoothly drive the pixels PXL may be used as the material configuring the second capacitor electrode UE and the initialization power line IPL. For example, the second capacitor electrode UE and the initialization power line IPL disposed on the second conductive layer may be made of a conductive polymer or a conductive metal oxide.

The second interlayer insulating layer 115 may be provided on the second conductive layer. In an embodiment, the second interlayer insulating layer 115 may be a second interlayer insulating film.

The second interlayer insulating layer 115 may include one or more inorganic films and/or organic films. For example, the second interlayer insulating layer 115 may be made of an inorganic film including $SiO_x$, $SiN_x$, or the like, but is not limited thereto. For example, the second interlayer insulating layer 115 may include an inorganic insulating material or an organic insulating material such as $SiO_x$, $SiN_x$, SiON, SiOF, or $AlO_x$, and may be a single film or multiple film including at least one of these materials.

The third conductive layer may be disposed on the second interlayer insulating layer 115. In an embodiment, the third conductive layer may be a source-drain layer.

The third conductive layer may be provided with the data line Dj, the power line PL, the connection wire CNL, the bridge pattern BRP, and the auxiliary connection wire AUX.

The data line Dj may be electrically connected to the second source electrode SE2 through the sixth contact hole CT6 passing through the gate insulating layer 113, the first interlayer insulating layer 114, and the second interlayer insulating layer 115.

The power line PL may be connected to the second capacitor electrode UE that is the upper electrode of the storage capacitor Cst through the third contact hole CT3 passing through the second interlayer insulating layer 115. In addition, the power line PL may be connected to the fifth source electrode SE5 through the fifth contact hole CT5 passing through the gate insulating layer 113, the first interlayer insulating layer 114, and the second interlayer insulating layer 115.

The connection wire CNL may be connected to the first gate electrode GE1 through the first contact hole CT1 passing through the first interlayer insulating layer 114 and the second interlayer insulating layer 115. In addition, the connection wire CNL may be electrically connected to the third drain electrode DE3 and the fourth source electrode SE4 through the second contact hole CT2 passing through the gate insulating layer 113, the first interlayer insulating layer 114, and the second interlayer insulating layer 115.

The bridge pattern BRP may be a pattern provided as a medium connecting the sixth drain electrode DE6 and the first electrode AD between the sixth drain electrode DE6 and the first electrode AD. This bridge pattern BRP may be electrically connected to the sixth drain electrode DE6 and the seventh source electrode SE7 through the fourth contact hole CT4 passing through the gate insulating layer 113, the first interlayer insulating layer 114, and the second interlayer insulating layer 115.

The auxiliary connection wire AUX may be connected to the initialization power line IPL through the eighth contact hole CT8 passing through the second interlayer insulating layer 115. In addition, the auxiliary connection wire AUX may be connected to the seventh drain electrode DE7 through the ninth contact hole CT9 passing through the gate insulating layer 113, the first interlayer insulating layer 114, and the second interlayer insulating layer 115.

The data line Dj, the power line PL, the connection wire CNL, the bridge pattern BRP and/or the auxiliary connection wire AUX disposed in the third conductive layer may be made of the same material. For example, the data line Dj, the power line PL, the connection wire CNL, the bridge pattern BRP and/or the auxiliary connection wire AUX may be formed of a predetermined source drain metal.

The source drain metal may be one of the metal materials previously presented as the example of the first and/or second gate metal, but is not limited thereto. In addition, the configuration material of the data line Dj, the power line PL, the connection wire CNL, the bridge pattern BRP and/or the auxiliary connection wire AUX, which are disposed in the third conductive layer, is not necessarily limited to metal. That is, a material capable of providing conductivity enough to smoothly drive the pixels PXL may be used as the material configuring the data line Dj, the power line PL, the connection wire CNL, the bridge pattern BRP and/or the auxiliary connection wire AUX. For example, the data line Dj, the power line PL, the connection wire CNL, the bridge pattern BRP and/or the auxiliary connection wire AUX may be made of a conductive polymer or a conductive metal oxide.

At least two of the first gate metal, the second gate metal, and the source drain metal may be formed of the same material. For example, the first gate metal and the second gate metal may be formed of the same material even though the first gate metal and the second gate metal are disposed on different layers. However, the exemplary embodiments of the invention are not limited thereto. For example, in another embodiment, all of the first gate metal, the second gate metal, and the source drain metal may be formed of different materials.

In various exemplary embodiments of the invention, when light incident on each of the active patterns, the first conductive layer, the second conductive layer, and the third conductive layer is reflected by each of the active patterns, the first conductive layer, the second conductive layer, and the third conductive layer, is reflected again by an upper layer, and is incident again, in order to prevent such light that is reflected again from acting as noise, the distance between the active patterns, the first conductive layer, the second conductive layer, and the third conductive layer may have a limited distance. For example, the distance between the active patterns, the first conductive layer, the second conductive layer, and the third conductive layer may be limited to about 300 μm or less. Thicknesses of the gate insulating layer 113, the first interlayer insulating layer 114, and the second interlayer insulating layer 115 may be determined based on the distance between the active patterns, the first conductive layer, the second conductive layer, and the third conductive layer, which is limited as described above.

The protective layer 116 may be provided on the third conductive layer. In an embodiment, the protective layer 116 may include a passivation film and/or a planarization film. The protective layer 116 may include a seventh contact hole CT7 exposing a portion of the bridge pattern BRP.

The light emitting element LD may be provided on the protective layer 116. The light emitting element LD may include the first electrode AD, the second electrode CD, and the light emitting layer LDL provided between the first and second electrodes AD and CD.

In an embodiment, the protective layer 116 may have a thickness of about 1500 Å to about 1800 Å, for example about 1600 Å, but the thickness of the protective layer 116 is not limited thereto.

At least one of the first electrode AD and the second electrode CD may be a transmissive electrode. For example, when the light emitting element LD is a back surface light emitting type organic light emitting display element, the first electrode AD may be a transmissive electrode and the second electrode CD may be a reflective electrode. On the other hand, when the light emitting element LD is a front surface light emitting type organic light emitting display element, the first electrode may be a reflective electrode and the second electrode may be a transmissive electrode. In addition, when the light emitting element LD is a both surface light emitting type organic light emitting display element, both of the first electrode AD and the second electrode CD may be transmissive electrodes. Hereinafter, a case where the light emitting element LD is a front surface light emitting type organic light emitting display element and the first electrode AD is an anode electrode will be described as an example. In addition, in the illustrated embodiment, the light emitting element LD is used as a light source, but the exemplary embodiments of the invention are not limited thereto. For example, the light emitting element LD may be replaced with another type of light emitting element.

The first electrode AD may be provided on the protective layer 116. The first electrode AD may be connected to the bridge pattern BRP through the seventh contact hole CT7 passing through the passivation layer 116. Since the bridge pattern BRP is connected to the sixth drain electrode DE6 and the seventh source electrode SE7 through the fourth contact hole CT4, the first electrode AD may be finally connected to the sixth drain electrode DE6 and the seventh source electrode SE7 through the bridge pattern BRP.

The first electrode AD may include a reflective film capable of reflecting light, and a transparent conductive film disposed above or under the reflective film. At least one of the transparent conductive film and the reflective film may be connected to the sixth drain electrode DE6 and the seventh source electrode SE7.

The reflective film may include a material capable of reflecting light. For example, the reflective film may include at least one of aluminum (Al), silver (Ag), chromium (Cr), molybdenum (Mo), platinum (Pt), nickel (Ni), and an alloy thereof.

The transparent conductive film may include a transparent conductive oxide. For example, the transparent conductive film may include at least one transparent conductive oxide among indium tin oxide ("ITO"), indium zinc oxide ("IZO"), aluminum zinc oxide ("AZO"), gallium doped zinc oxide ("GZO"), zinc tin oxide ("ZTO"), gallium tin oxide ("GTO"), and fluorine doped tin oxide ("FTO").

The light emitting layer LDL may be disposed on an exposed surface of the first electrode AD. The light emitting layer LDL may have a multilayer thin film structure including a light generation layer ("LGL"). For example, the light emitting layer LDL may include a hole injection layer ("HIL") for injecting holes, a hole transport layer ("HTL") for increasing a hole recombination opportunity by suppressing movement of electrons that are excellent in transportability of holes and are not combined in the light generation layer, the light generation layer for emitting light by recombination of the injected electrons and holes, a hole blocking layer ("HBL") for suppressing the movement of the holes that are not combined in the light generation layer, an electron transport layer ("ETL") for smoothly transporting the electrons to the light generation layer, and/or an electron injection layer ("EIL") for injecting the electrons.

The color of light generated in the light generation layer may be one of red, green, blue, and white, but the exemplary embodiments of the invention are not limited thereto. For example, the color of light generated in the light generating layer of the light emitting layer LDL may be one of magenta, cyan, and yellow.

The hole injection layer, the hole transport layer, the hole blocking layer, the electron transport layer, and the electron injection layer may be a common film connected with each other in adjacent light emitting areas.

The second electrode CD may be a transflective film. For example, the second electrode CD may be a thin film metal layer having a thickness enough to transmit the light emitted from the light emitting layer LDL. For example, the second electrode CD may transmit is some of the light emitted from the light emitting layer LDL and reflect the remains of the light emitted from the light emitting layer LDL.

In an embodiment, the second electrode CD may include a material having a work function lower than that of the transparent conductive film. For example, the second electrode CD may include at least one molybdenum (Mo), tungsten (W), silver (Ag), magnesium (Mg), aluminum (Al), platinum (Pt), palladium (Pd), nickel (Ni), neodymium (Nd), iridium (Ir), chromium (Cr), lithium (Li), calcium (Ca), and an alloy thereof.

Some of the light emitted from the light emitting layer LDL may not transmit the second electrode CD and the light reflected from the second electrode CD may be reflected again in the reflective film. That is, the light emitted from the light emitting layer LDL may resonate between the reflective film and the second electrode CD. A light extraction efficiency of the organic light emitting elements LD may be improved by the resonance of the light.

The pixel definition film (or bank layer) 117 for partitioning the light emitting area of each pixel PXL may be provided on the first substrate SUB1 on which the first electrode AD and the like are disposed. The pixel definition film 117 may expose an upper surface of the first electrode AD and may be protruded from the first substrate SUB1 along a circumference of each light emitting area.

The light emitting area or layer LDL may be provided in the light emitting area of each pixel PXL surrounded by the pixel definition film 117 and the second electrode CD may be provided on the light emitting layer LDL. One of the first electrode AD and the second electrode CD may be an anode electrode and the other may be a cathode electrode. For example, the first electrode AD may be an anode electrode, and the second electrode CD may be a cathode electrode.

The pixel definition film 117 may include an organic insulating material. For example, the pixel definition film 117 may include at least one of polystyrene, polymethylmethacrylate ("PMMA"), polyacrylonitrile ("PAN"), polyamide ("PA"), polyimide ("PI"), polyarylether ("PAE"), heterocyclic polymer, chemical vapor deposited polymers sold under the trade designation PARYLENE by Specialty Coating Systems, Inc. of Indianapolis, Ind., epoxy, benzocyclobutene ("BCB"), siloxane based resin, and silane based resin.

The first protective layer PTL1 covering the second electrode CD may be provided on the second electrode CD as a layer 118. The first protective layer PTL1 may be formed of a thin film encapsulation layer. In an embodiment, the thin film encapsulation layer may be replaced with another type of encapsulation film, encapsulation substrate, protective film of at least one layer, or the like.

The thin film encapsulation layer may prevent oxygen and moisture from penetrating into the light emitting element LD. To this end, the thin film encapsulation layer may include an inorganic film. The inorganic film may include at least one of silicon oxide, silicon nitride, silicon oxynitride, aluminum oxide, titanium oxide, zirconium oxide, and tin oxide.

Each of the circuit elements and the wires disposed on the first surface of the first substrate SUB1 from the buffer layer 112 to the protective layer 116 may configure the circuit element layer BPL of the display device 10 and/or the fingerprint sensor. In addition, the light emitting elements LD disposed in each pixel PXL from the first electrode AD to the second electrode CD and the thin film encapsulation layer disposed between the light emitting elements LD may configure the light emitting element layer LDL of the display device 10 and/or the fingerprint sensor.

Further referring to FIGS. 11 to 13, the pixel PXL may include the first light transmission hole LTH1 formed in at least one conductive layer of the circuit element layer BPL. The sensing area SA may include the plurality of pixels PXL including the light transmission hole LTH.

The first light transmission hole LTH1 may include multilayer opening portions MLO formed so as to overlap with a plurality of conductive layers configuring the circuit element layer BPL. For example, the first light transmission hole LTH1 may include the multilayer opening portions MLO formed so as to overlap with at least two layers of the semiconductor layer in which the active patterns of the circuit element layer BPL are disposed, the first conductive layer in which the gate electrodes GE1 to GE7 are disposed, the second conductive layer in which the second capacitor electrode UE and the like are disposed, the third conductive layer in which the power line PL and the like are disposed, and the third conductive layer in which the bridge pattern BRP and the like are disposed.

According to the above-described embodiment, a light transmission hole array for receiving reflection light integrally with the light emitting element layer LDL and the circuit element layer BPL may be formed without forming an additional layer in the circuit element layer BPL. Therefore, the module thickness of the display device 10 may be reduced.

On the other hand, in various exemplary embodiments of the invention, the position and the form of the first light transmission hole LTH1 are not limited to those shown in FIGS. 15 to 17. That is, in various other embodiments, the first light transmission hole LTH1 may be formed in another area, for example, an area including the opening portion OPN formed in the first gate electrode GE1. In such an embodiment, the layout structure may be variously modified so that the conductive layer is not disposed in the first light transmission hole LTH1.

The size (width or diameter) of the first light transmission hole LTH1 may be determined by a size of the opening portions MLO. For example, the widths W1 and W2 of the first light transmission hole LTH1 may be determined to be a smallest width among the widths of the opening portions MLO.

At least a portion of the opening portions MLO forming the first light transmission holes LTH1 may overlap the pinholes PIH of the light shielding layer PHL described with reference to FIGS. 1 to 12C. In such an embodiment, the width W' of the first light transmission hole LTH1 may be the same as or different from the width W of the pinhole PIH.

In an embodiment, the width W' of the first light transmission hole LTH1 may be smaller than the width W of the pinhole PIH. For example, the pinhole PIH and the first light transmission hole LTH1 may have a width of a range of about 5 μm to about 20 μm, and the width W' of the first light transmission hole LTH1 may be set to be smaller than the width W of the pinhole PIH.

In an embodiment, when the pinholes PIH and the first light transmission holes LTH1 have a generally rectangular shape, the length of a first side of the pinholes PIH may be about 8.5 μm, and the length of a second side perpendicular to the first side may be about 9.4 μm. In addition, in such an embodiment, the length of a first side of the first light transmission holes LTH1 may be about 4.5 μm, and the length of a second side perpendicular to the first side may be about 5.4 μm. Such numerical values are merely an example, and the exemplary embodiments of the invention are not limited thereto.

In the embodiment in which the first light transmission holes LTH1 have a size smaller than that of the pinholes PIH, the first light transmission hole array layer LTHL1 may perform the function of the light control layer LBL controlling the path of the light (for example, limiting the field of view of the reflection light to a predetermined angle range), and the light shielding layer PHL may perform a light blocking function.

However, the exemplary embodiments of the invention are not limited thereto. That is, in another embodiment, the width W' of the first light transmission hole LTH1 may be larger than the width W of the pinhole PIH. In such an embodiment, the first light transmission hole array layer LTHL1 may perform the light blocking function and the light shielding layer PHL may perform the function of the light control layer LBL controlling the path of the light.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A fingerprint sensor for a display device comprising:
  a substrate having first and second surfaces;
  a light transmission layer including a first layer disposed on the first surface of the substrate and having first openings in at least one first conductive layer, and a second layer disposed on the first surface of the substrate and having second openings in at least one second conductive layer;
  a light emitting element layer disposed on the first layer and the second layer and having at least one light emitting element; and
  a sensor layer disposed on the second surface of the substrate and having light sensors,
  wherein at least a portion of the first openings and at least a portion of the second openings at least partially overlap and have different sizes,
  wherein the second layer includes:
    circuit elements to control light emission of the at least one light emitting element;
    a semiconductor layer including an active pattern of the circuit elements;

a first gate layer including a gate electrode overlapping the active pattern and a light emitting control line to supply a light emitting control signal to the circuit elements; and a second gate layer disposed between the first gate layer and a source-drain layer and including at least one capacitor electrode and an initialization power line to supply initialization power to the circuit elements, and wherein the source-drain layer includes a source electrode, a drain electrode connected to the active pattern, and a power line to apply power to the circuit elements.

2. The fingerprint sensor according to claim 1, wherein the first openings and the second openings have widths or diameters between about 5 μm and about 20 μm.

3. The fingerprint sensor according to claim 1, wherein the first openings and the second openings have a generally quadrangle shape in which a width in a first direction and a width in a second direction perpendicular to the first direction are the same or different.

4. The fingerprint sensor according to claim 1, wherein widths of the first openings are greater than widths of the second openings.

5. The fingerprint sensor according to claim 4, wherein the first layer comprises a first light shielding layer to block some of ambient incident light and to transmit the remaining ambient incident light through the first openings, and the second layer comprises a second light shielding layer to limit a field of view of the light.

6. The fingerprint sensor according to claim 1, wherein the second openings comprise multilayer opening portions that overlap each other between the circuit elements disposed in the semiconductor layer, the first gate layer, the second gate layer, and the source-drain layer.

7. The fingerprint sensor according to claim 1, wherein a distance between the semiconductor layer and the source-drain layer is about 300 μm or less.

8. The fingerprint sensor according to claim 1, wherein the second openings comprise multilayer openings adjacent to and overlapping the active pattern, the light emitting control line, the initialization power line, and the power line.

9. The fingerprint sensor according to claim 1, further comprising:

a protective layer disposed between the first substrate and the sensor layer; and an adhesive layer disposed between the first substrate and the protective layer.

10. A display device comprising:

a substrate having first and second surfaces;

a light transmission layer disposed on the first surface of the substrate and including first openings having a first size;

a circuit element layer disposed on the first surface of the substrate and including a plurality of conductive layers and second openings in the plurality of conductive layers, the second openings having at least a portion overlapping the first openings and having a second size different from the first size;

a light emitting element layer disposed on the circuit element layer and including at least one light emitting element; and a sensor layer disposed on the second surface of the substrate and including light sensors, wherein the circuit element layer comprises:

circuit elements to control light emission of the at least one light emitting element;

a semiconductor layer including an active pattern of the circuit elements;

a first gate layer including a gate electrode overlapping the active pattern and a light emitting control line to supply a light emitting control signal to the circuit elements; and a second gate layer disposed between the first gate layer and a source-drain layer and including at least one capacitor electrode and an initialization power line to supply initialization power to the circuit elements, and wherein the source-drain layer includes a source electrode, a drain electrode connected to the active pattern, and a power line to apply power to the circuit elements.

11. The display device according to claim 10, wherein the first openings and the second openings have widths or diameters between about 5 μm and about 20 μm.

12. The display device according to claim 10, wherein the first size comprises a first width and the second size comprises a second width, the first width being greater than the second width.

13. The display device according to claim 12, wherein the light transmission layer comprises a light shielding layer to block some of ambient incident light and to transmit the remaining ambient incident light through the first openings, and the circuit element layer to limit a field of view of the light.

14. The display device according to claim 10, wherein a distance between the semiconductor layer and the source-drain layer is about 300 μm or less.

* * * * *